United States Patent [19]

Takeoka et al.

[11] Patent Number: 5,430,736
[45] Date of Patent: Jul. 4, 1995

[54] METHOD AND APPARATUS FOR GENERATING TEST PATTERN FOR SEQUENTIAL LOGIC CIRCUIT OF INTEGRATED CIRCUIT

[75] Inventors: Sadami Takeoka, Moriguchi; Akira Motohara, Kobe, both of Japan

[73] Assignee: Matsushita Electric Industrial, Co., Ltd., Osaka, Japan

[21] Appl. No.: 868,737

[22] Filed: Apr. 15, 1992

[30] Foreign Application Priority Data

Apr. 16, 1991 [JP] Japan .................................. 3-083846
Aug. 23, 1991 [JP] Japan .................................. 3-212255
Mar. 30, 1992 [JP] Japan .................................. 4-072049

[51] Int. Cl.⁶ .......................................... G06F 11/263
[52] U.S. Cl. .................................. 371/23; 371/22.3; 371/27; 364/579
[58] Field of Search .................... 371/22.3, 23, 27; 364/579, 580

[56] References Cited

U.S. PATENT DOCUMENTS 4,716,564 12/1987 Hung et al. ............................ 371/27
4,894,830 1/1990 Kawai ................................ 371/22.3
4,991,176 2/1991 Dahbura et al. ...................... 371/27
5,132,974 7/1992 Rosales .............................. 371/22.3
5,291,495 3/1994 Udell, Jr. ............................. 371/23

FOREIGN PATENT DOCUMENTS

0408018A2 1/1991 European Pat. Off. .

OTHER PUBLICATIONS

Waicukauski et al., "ATPG for Ultra-Large Structured Designs," *1990 International Test Conference*, IEEE, pp. 44–51.
"An Interactive Sequential Test Pattern Generation System", Razdan et al., 1989 International Test Conference, Washington, D.C., pp. 38–46.
"Test Generation for Sequential Circuits", IEEE Transactions on Computer-Aided Design, vol. 7, No. 10, Oct. 1988, Tony et al., pp. 1081–1093.
"Combinational Profiles of Sequential Benchmark Circuits", Brglez et al., IEEE 1989, Triangle Park, N.C., pp. 1929–1934.
"Concurrent Test Generation and Design for Testability", Cheng et al., IEEE 1989, Murray Hill, N.J., pp. 1935–1938.
"A Partial Scan Method for Sequential Circuits with Feedback", IEEE Transactions on Computers, vol. 39, No. 4, Apr. 1990, pp. 544–548.

*Primary Examiner*—Emanuel T. Voeltz
*Assistant Examiner*—Kyle J. Choi
*Attorney, Agent, or Firm*—Wenderoth, Lind & Ponack

[57] ABSTRACT

In an apparatus for generating a test pattern for a sequential logic circuit including a plurality of storage elements each storage element storing a logical value of one bit wherein logical values of bits of the plurality of storage elements being represented by a state, first external input values are generated so that a transition process is performed from a second state of the plurality of storage elements to a first state thereof, and second external input values are generated so hat a transition process is performed from a third state of the plurality of storage elements to the first state thereof. Thereafter, third external input values are generated so that a transition process is performed from a fourth state of the plurality of storage elements to the first state thereof. After setting the fourth state as the first state, name data of storage elements corresponding to bits of different states between the second and third states are stored in a storage unit. After setting the third state as the first state, there is increased a degree of requesting a scan operation for each of the storage elements, name data of which have been stored in the storage unit. Then, storage elements to be scanned are selected for generating an improved test pattern based on the degree of requesting the scan operation.

28 Claims, 24 Drawing Sheets

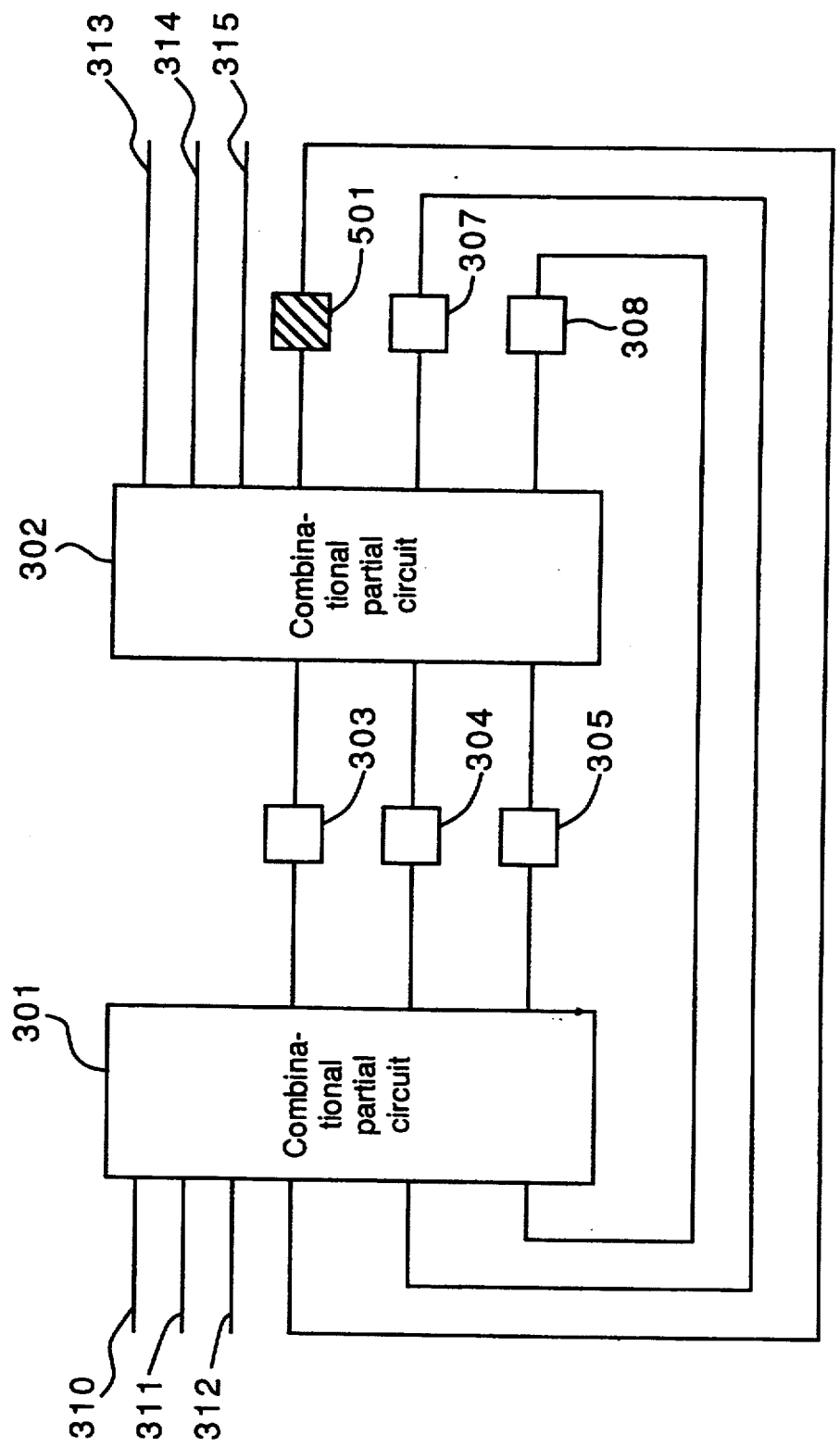

METHOD AND APPARATUS FOR GENERATING TEST PATTERN FOR SEQUENTIAL LOGIC CIRCUIT OF INTEGRATED CIRCUIT

BACKGROUND OF THE INVENTION

1. Field of the Invention

The present invention relates to a method and apparatus for generating a test pattern to a method and apparatus for generating a test pattern or a sequential logic circuit of an integrated circuit (referred to as an IC hereinafter) comprising a plurality of storage elements.

2. Description of the Prior Art

FIG. 18 shows one flip-flop having a scan function used in a conventional IC.

Referring to FIG. 18, the flip-flop comprises a delay type flip-flop element FF for storing a logical value of one bit and a selector SEL. When a control signal applied through an external terminal T3 to a selection control terminal CONT of the selector SEL has a low level or when a normal mode is set, a signal applied to a first input terminal T1 is passed through the selector SEL to the flip-flop element FF and is outputted therefrom through a first output terminal T11. On the other hand, when the control signal applied through the external terminal T3 to the selection control terminal CONT of the selector SEL has a high level or when a scan mode is set, a signal applied to a second input terminal T2 is passed through the selector SEL to the flip-flop element FF and is outputted therefrom through a second output terminal T12. Namely, when the flip-flop shown in FIG. 18 is converted into a scan flip-flop, the signal applied to the second input terminal T2 is passed through the selector SEL and the flip-flop element FF and is outputted trough the second output terminal T12.

Generally speaking, in a conventional IC, when a normal flip-flop is converted into a flip-flop having a so-called scan structure (referred to as a scan flip-flop hereinafter), the dimension of the IC increases since an extra dimension of the scan flip-flop is added to the original dimension thereof. Therefore, it is necessary to provide a method of selecting flip-flops to be converted into scan flip-flops so that a number of flip-flops to be converted thereto becomes a value as small as possible, or so that a higher fault coverage can be obtained.

A conventional method of selecting flip-flops to be converted into scan flip-flops is disclosed in a reference (referred to as a first reference hereinafter) of Kwang-ting Cheng et al. "A Partial Scan Method for Sequential Circuits with Feedback", IEEE Transactions on Computers, Vol. 39, No. 4, pp. 544 to 548, April 1990. The conventional method thereof will be described below with reference to FIGS. 3, 15 and 16.

FIG. 3 shows a partial circuit of a conventional IC.

Referring to FIG. 3, the partial circuit of the IC comprises combinational partial circuits 301 and 302, delay type flip-flops (referred to as flip-flops hereinafter) 303, 304 and 305 connected between output terminals of the combinational partial circuit 301 and input terminals of the combinational partial circuit 302, and flip-flops 306, 307 and 308 connected between output terminals of the combinational partial circuit 302 and input terminals of the combinational partial circuit 301. Further, external input lines 310, 311 and 312 are connected to the other input terminals of the combinational partial circuit 301, and external output lines 313, 314 and 315 are connected to the other output terminals of the combinational partial circuit 302. Therefore, as is clear from FIG. 3, the partial circuit thereof has a feedback loop structure therein. Namely, in the partial circuit of the IC shown in FIG. 3, there are (a) a first loop where an output terminal of the flip-flop 303 is connected through the combinational partial circuit 302, the flip-flop 306 and the combinational partial circuit 301 to an input terminal of the flip-flop 303;

(b) a second loop where an output terminal of the flip-flop 304 is connected through the combinational partial circuit 302, the flip-flop 307 and the combinational partial circuit 301 to an input terminal of the flip-flop 304; and (c) a third loop where an output terminal of the flip-flop 305 is connected through the combinational partial circuit 302, the flip-flop 308 and the combinational partial circuit 30 to an input terminal of the flip-flop 305.

FIG. 15 is a flowchart of a test pattern generation process executed by a conventional test pattern generation apparatus.

Referring to FIG. 15, first of all, at step 1602, a circuit structure of a sequential logic circuit of an IC to be tested is analyzed, and then, a determination is made as to whether or not there is a complicated or large feedback loop in the sequential logic circuit based on the connection relationship among the flip-flops. Thereafter, the flip-flops constituting the feedback loop are converted into scan flip-flops at step 1603, and then, a test pattern is generated at step 1604 for a partial circuit in which the flip-flops have been converted into the scan flip-flops at step 1603.

When the test pattern generation process is executed for the partial circuit of the IC shown in FIG. 3, three loops of the above-mentioned first to third loops are detected at step 1602, and then, it is determined that the flip-flops 303 to 305 constituting the loops respectively are to be scanned. Thereafter, the flip-flops 303 to 305 are converted into scan flip-flops 1701 to 1703 at step 1603, as shown in FIG. 16. Finally, a test pattern is generated at step 1604 for a partial circuit in which the flip-flops 303 to 305 have been converted into the scan flip-flops 1701 to 1703 at step 1603.

However, in the conventional test pattern generation apparatus, since the flip-flops which may have a possibility of a trouble which may be caused upon generating a test pattern are selected as the flip-flops to be scanned from only the circuit structure of the partial circuit, the operator can not judge whether or not all the selected flip-flops are necessary to be converted into the scan flip-flops upon generating the test pattern in practice. Therefore, since there are flip-flops which have no effect of improving the fault coverage upon generating the test pattern among the flip-flops which have scanned in the conventional apparatus, a number of the flip-flops to be scanned increases, and then, the above-mentioned extra dimension of the scanned flip-flops increases.

Further, in the conventional apparatus, if the number of the scanned flip-flops is increased upon generating a test pattern, the test patterns which have been generated already become invalid. Therefore, the conventional test pattern generation apparatus can not be used in practice.

SUMMARY OF THE INVENTION

An object of the present invention is therefore to provide an apparatus for generating a test pattern for a sequential logic circuit of an IC comprising a plurality of storage elements, which is capable of decreasing a number of storage elements to be scanned and obtaining a higher fault coverage.

Another object of the invention is to provide an apparatus capable of newly generating a test pattern for a sequential logic circuit of an IC comprising a plurality of storage elements, after editing a test pattern when scan storage elements are newly added to the original sequential logic circuit upon generating the test pattern.

A further object of the invention is to provide an apparatus capable of newly generating a test pattern for a sequential logic circuit of an IC comprising a plurality of storage elements, capable of decreasing the cost of the controllability of the IC.

A still further object of the present invention is to provide a method of generating a test pattern for a sequential logic circuit of an IC comprising a plurality of storage elements, which is capable of decreasing a number of storage elements to be scanned and obtaining a higher fault coverage.

A still more further object of the invention is to provide a method capable of newly generating a test pattern for a sequential logic circuit f an IC comprising a plurality of storage elements, after editing a test pattern when scan storage elements are newly added to the original sequential logic circuit upon generating the test pattern.

Still another object of the invention is to provide a method capable of newly generating a test pattern for a sequential logic circuit of an IC comprising a plurality of storage elements, capable of decreasing the cost of the controllability of the IC.

In order to achieve the aforementioned objective, according to one aspect of the present invention, there is provided an apparatus for generating a test pattern for a sequential logic circuit including a plurality of storage elements each storage element storing a logical value of one bit, logical values of bits of said plurality of storage elements being represented by a state, said apparatus comprising:

first input value generating means for generating a combination of first external input values so that a transition process is performed from a second state of said plurality of storage elements to a first state thereof;

first state generating means for generating a third state different from said second state by a predetermined natural number of bits;

second input value generating means for generating a combination of second external input values so that a transition process is performed from a third state of said plurality of storage elements to said first state thereof;

second state generating means for generating a fourth state other than said first to third states;

third input value generating means for generating a combination of third external input values so that a transition process is performed from a fourth state of said plurality of storage elements to said first state thereof;

first setting means for setting said fourth state as said first state;

storage means for storing name data of storage elements corresponding to bits of different states between said second and third states;

second setting means for setting said third state as said first state;

scan request degree increasing means for increasing a degree of requesting a scan operation for each of said storage elements, name data of which have been stored in said storage means;

scan storage element selecting means for selecting storage elements to be scanned based n said degree of requesting the scan operation;

scan converting means for converting said storage elements selected by said scan storage element selecting means into scan storage elements; and test pattern generating means for generating a test pattern for said sequential logic circuit when said storage elements selected by said scan storage element selecting means are converted into scan storage elements by said scan converting means.

According to another aspect of the present invention, there is provided an apparatus for generating a test pattern for a sequential logic circuit including a plurality of storage elements each storage element storing a logical value of one bit, logical values of bits of said plurality of storage elements being represented by a state, said apparatus comprising:

input value generating means for generating a combination of external input values so that effects of a fault of said sequential logic circuit reach external output terminals thereof;

storage element selecting means for selecting storage elements, states of which are necessary to be changed in order that the effects of the fault of said sequential logic circuit reach said external output terminals thereof;

storage means for storing said storage elements selected by said storage element selecting means;

scan request degree increasing means for increasing a degree of requesting a scan operation for each of said storage elements, name data of which have been stored in said storage means;

scan storage element selecting means for selecting storage elements to be scanned based on said degree of requesting the scan operation;

scan converting means for converting said storage elements selected by said scan storage element selecting means into scan storage elements; and test pattern generating means for generating a test pattern for said sequential logic circuit when said storage elements selected by said scan storage element selecting means are converted into scan storage elements by said scan converting means.

According to a further aspect of the present invention, there is provided an apparatus for generating a test pattern for a sequential logic circuit including a plurality of storage elements, comprising:

calculating means for calculating each testability cost of said sequential logic circuit required for testing said sequential logic circuit when each of a plurality of storage elements is converted into a scan storage element;

testability cost selecting means for selecting the minimum testability costs among the controllabilities calculated by said calculating means;

storage element selecting means or selecting a storage element corresponding to the minimum testability cost selected by said testability cost selecting means;

scan converting means for converting said storage elements selected by said storage element selecting means into scan storage elements; and test pattern generating means for generating a test pattern for said sequential logic circuit when said storage elements selected by said scan storage element selecting means are converted into scan storage elements by said scan converting means.

According to a still further aspect of the present invention, there is provided an apparatus for generating a test pattern for a sequential logic circuit including a plurality of storage elements each storage element storing a logical value of one bit, logical values of bits of said plurality of storage elements being represented by a state, said apparatus comprising:

fault selecting means for selecting a fault among a plurality of faults of said sequential logic circuit;

test pattern generating means for generating a test pattern for said fault selected by said fault selecting means;

state storage means for storing both of states of said plurality of storage elements when storage elements to be scanned are scanned-in and sates of said plurality of storage elements when said storage elements to be scanned are not scanned-in in the case that said test pattern is generated by said test pattern generating means;

scan storage element selecting means for selecting a storage element to be scanned among said storage elements to be scanned in the case that said test pattern is generated by said test pattern generating means;

scan converting means for converting said storage element selected by said storage element selecting means into scan storage elements; and test pattern generating means for generating a test pattern for said sequential logic circuit when said storage elements selected by said scan storage element selecting means are converted into scan storage elements by said scan converting means, based on said states thereof stored in said storage means.

According to a still more further aspect of the present invention, there is provided a method of generating a test pattern for a sequential logic circuit including a plurality of storage elements each storage element storing a logical value of one bit, logical values of bits of said plurality of storage elements being represented by a state, said method including steps of:

generating a combination of first external input values so that a transition process is performed from a second state of said plurality of storage elements to a first state thereof;

generating a third state different from said second state by a predetermined natural number of bits;

generating a combination of second external input values so that a transition process is performed from a third state of said plurality of storage elements to said first state thereof;

generating a fourth state other than said first to third states;

generating a combination of third external input values so that a transition process is performed from a fourth state of said plurality of storage elements to said first state thereof;

setting said fourth state as said first state;

storing in storage means name data of storage elements corresponding to bits of different states between said second and third states;

setting said third state as said first state;

increasing a degree of requesting a scan operation for each of said storage elements, name data of which have been stored in said storage means;

selecting storage elements to be scanned based on said degree of requesting the scan operation;

converting said selected storage elements into scan storage elements; and generating a test pattern for said sequential logic circuit when said selected storage elements are converted into scan storage elements.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5 is a block diagram of the partial sequential logic circuit of the first example of the IC shown in FIG. 3 when a flip-flop 306 is converted into a scan flip-flop 501;

FIGS. 14a to 14d are block diagrams of partial sequential logic circuits showing a test pattern generation process executed by the test pattern generation apparatus of the fourth preferred embodiment;

DETAILED DESCRIPTION OF THE PREFERRED EMBODIMENTS

The preferred embodiments according to the present invention will be described below with reference to the attached drawings.

In the specification, a cost required for testing a sequential circuit of an IC is referred to as a cost of a testability, and the cost of the testability includes a cost of a controllability for generating a test pattern required for setting logical values of signal lines within a sequential circuit to desired values, and a cost of an observability for generating a test pattern required for observing logical values of signal lines within the sequential circuit at external output terminals, etc. In some of the preferred embodiments described below, the cost of the testability includes only the cost of the controllability. Further, in the preferred embodiments, sequential logic circuits of ICs comprise combinational partial circuits and a plurality of delay type flip-flops each flip-flop storing a logical value of one bit, wherein logical values of bits of a plurality of flip-flops are represented by a state, for example, as shown in state transition diagrams of FIGS. 4a to 4g and 6.

First Preferred Embodiment

Figure 17:
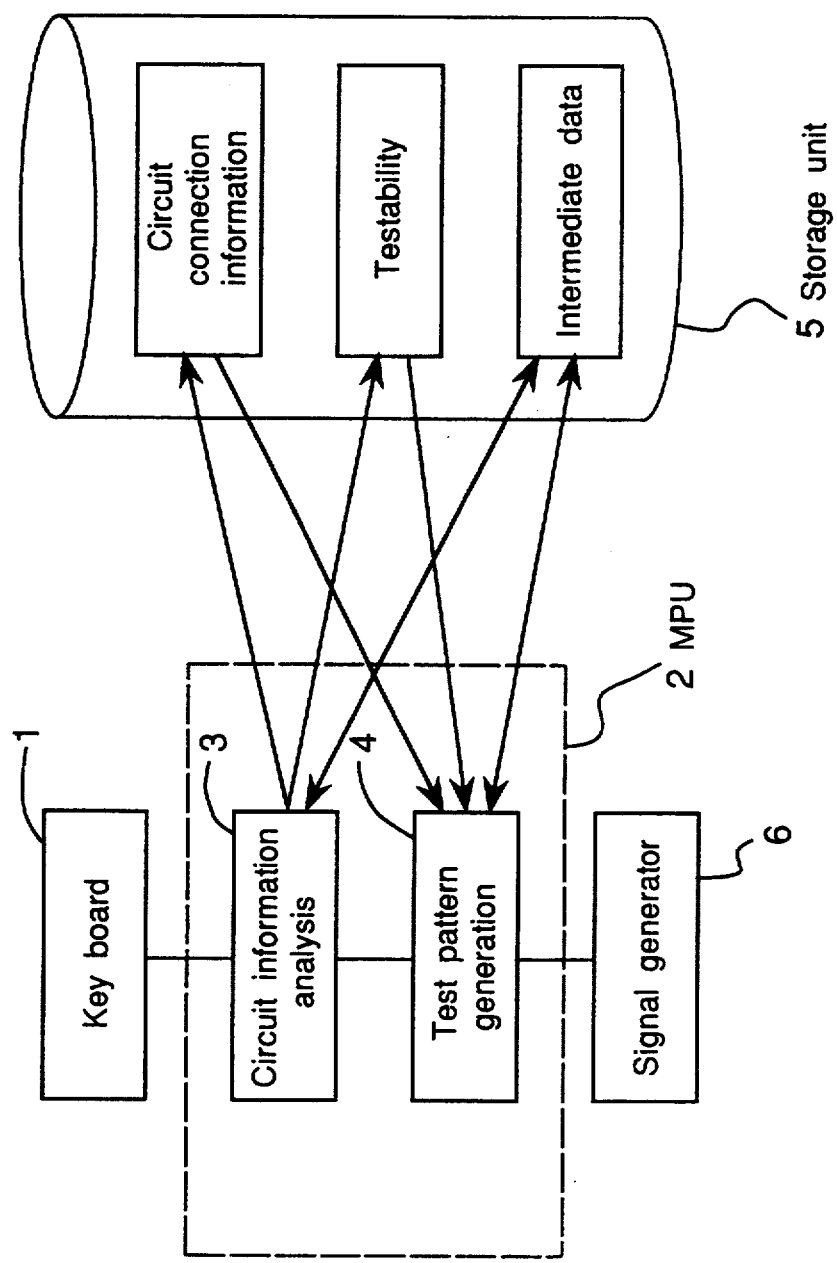
FIG. 17 is a block diagram showing a test pattern generation apparatus of the first preferred embodiment shown in FIG. 1.
Figure 18:
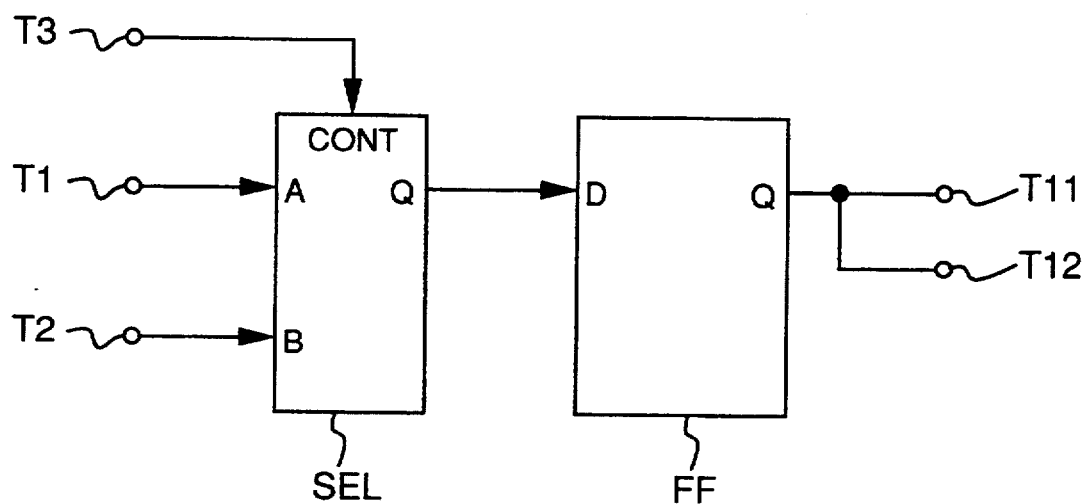
FIG. 18 is a block diagram showing one delay type flip-flop having a scan function used in the conventional device and the devices of the preferred embodiments.

FIG. 17 shows a test pattern generation apparatus of a first preferred embodiment according to the present invention.

Referring to FIG. 17, a microprocessor unit (MPU) 2 is connected to a key board 1 for inputting circuit information of a sequential logic circuit of an IC to be tested, a storage unit 5 and a signal generator 6. The microprocessor unit 2 comprises not only a means 3 for analyzing the circuit information inputted using the keyboard 1 and for storing circuit connection information, testability data and intermediate data caused by the above-mentioned analysis, but also a means 4 for generating a test pattern for the sequential logic circuit of the IC to be tested based on the circuit connection information, the testability data, and the intermediate data and outputting them to the signal generator 6. Finally, the signal generator 6 generates electrical test pattern signals in a predetermined available form and outputs them to the sequential logic circuit of the IC to be tested.

Figure 1:
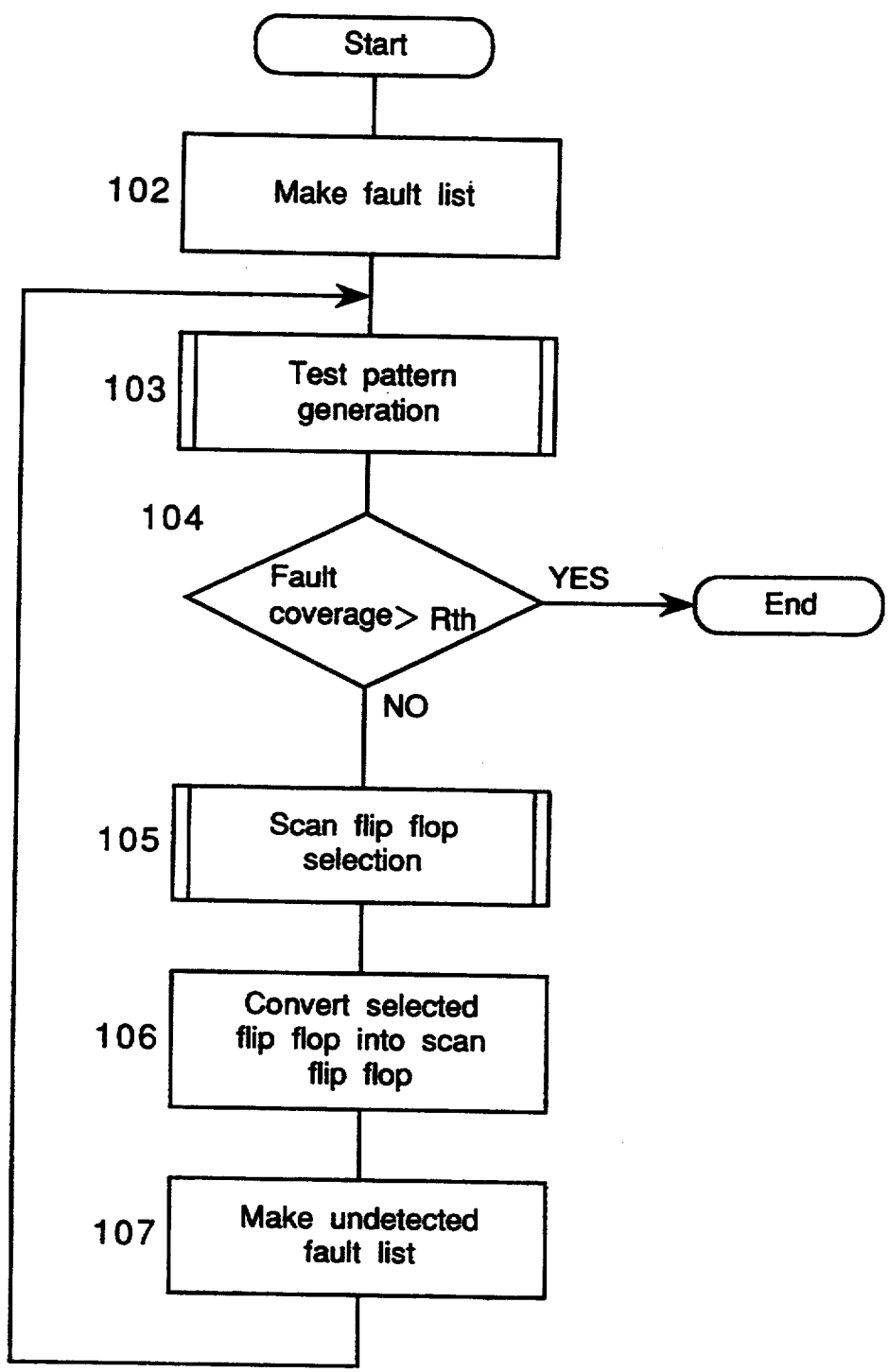
FIG. 1 is a flowchart of a main routine executed by a test pattern generation apparatus of a first preferred embodiment according to the present invention.

FIG. 1 is a flowchart of a main routine executed by the test pattern generation apparatus of the first preferred embodiment shown in FIG. 17.

Figure 2A:
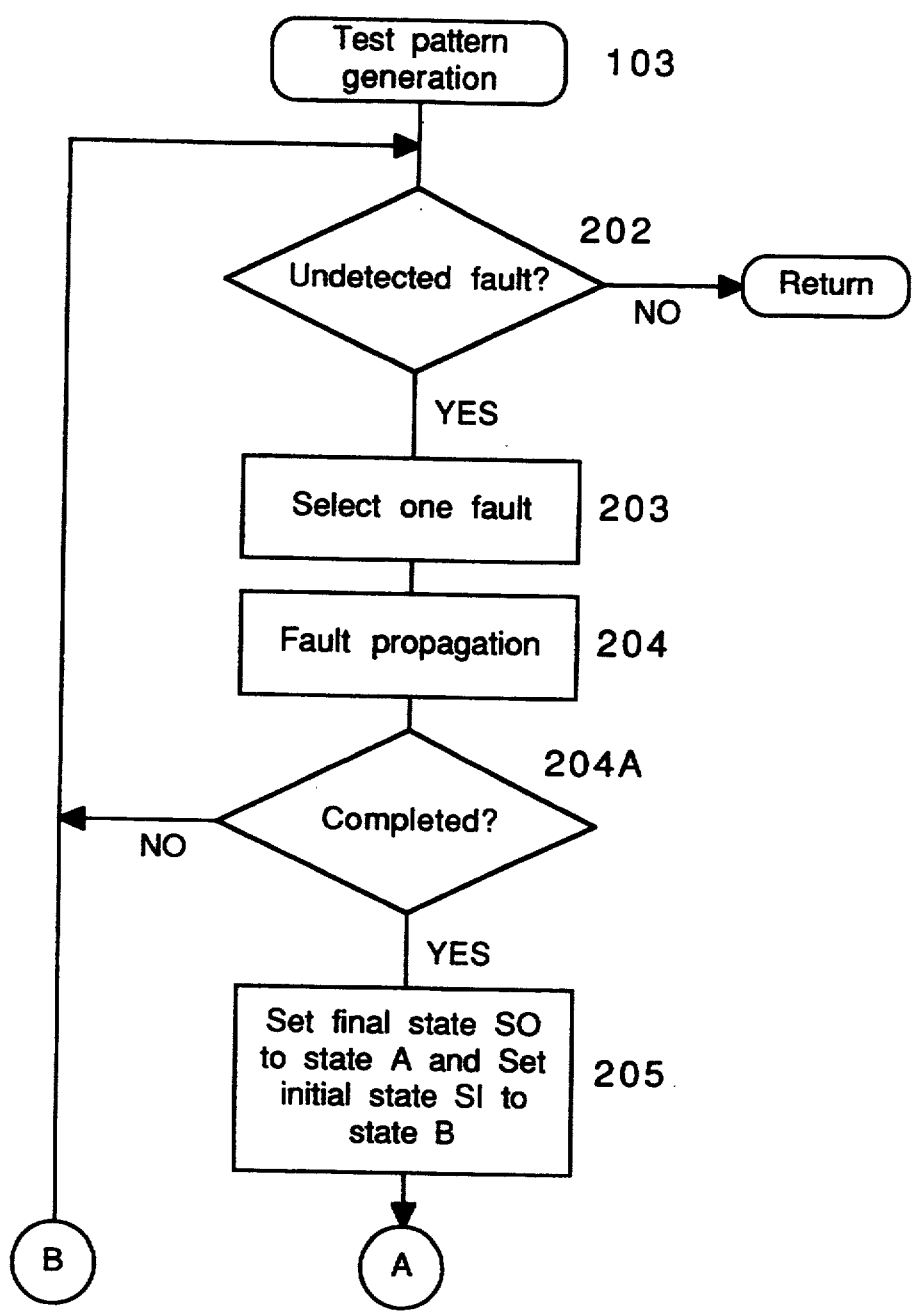
FIGS. 2a and 2b are flowcharts of a test pattern generation process of a subroutine step 103 shown in FIG. 1.
Figure 2B:
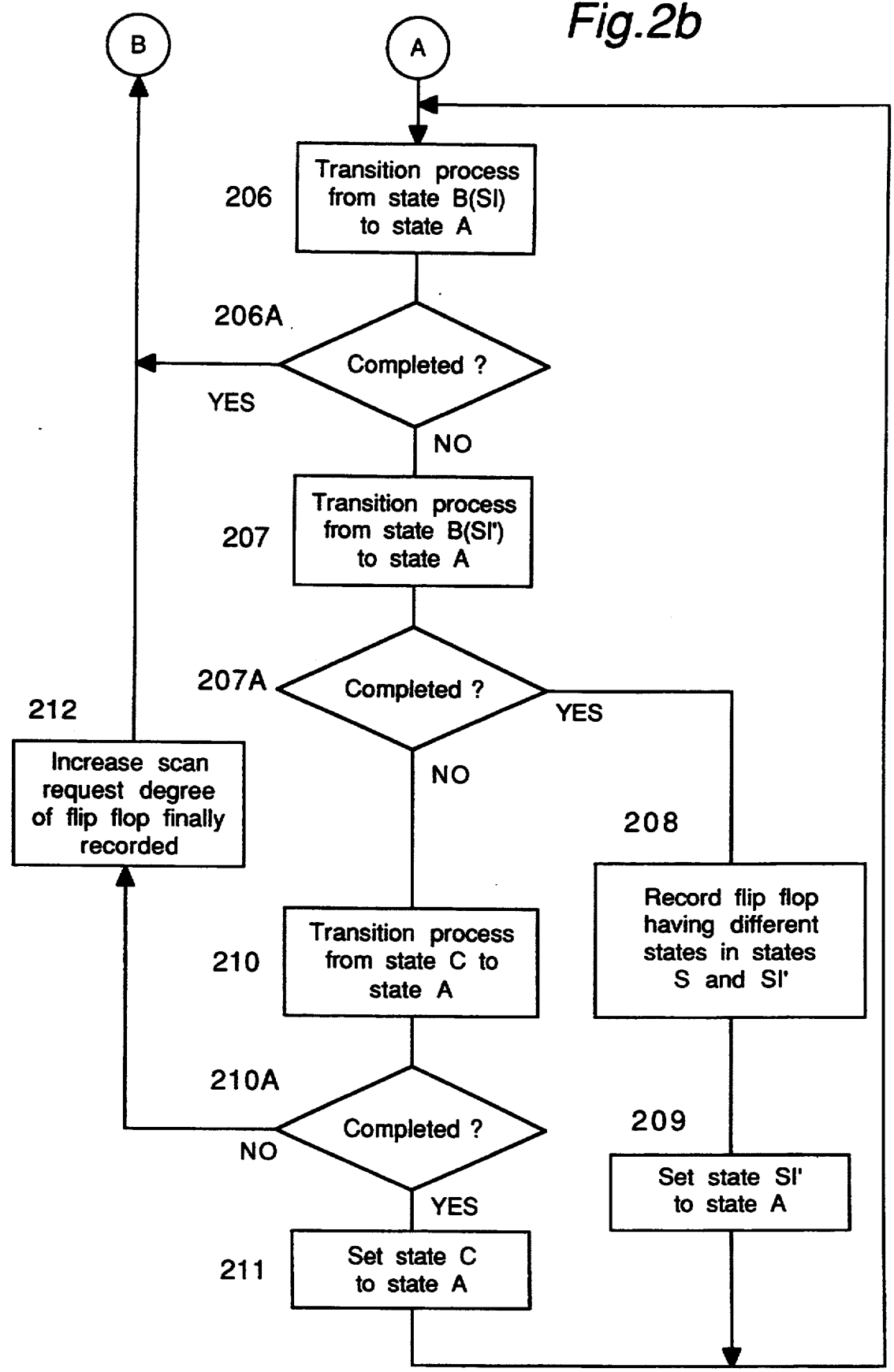

Referring to FIG. 1, first of all, at step 102 a fault list is made including all the flip-flops in fault states within the sequential logic circuit of the IC to be tested, and then, at step 103 a test pattern generation process of a subroutine is executed at step 103 shown in FIGS. 2a and 2b. Namely, at step 103, test patterns are generated for the respective faults specified in the fault list, respectively, electrical test pattern signals are applied from the signal generator 6 to the sequential logic circuit, and then, a fault coverage is detected. Thereafter, a determination is made at step 104 as to whether or not the detected fault coverage is larger than a predetermined threshold fault coverage Rth of, for example, 95%.

If the detected fault coverage is larger than the predetermined threshold fault coverage Rth (YES at step 104), the test pattern which has been finally generated at step 103 is set as the test pattern to be used for the sequential logic circuit, and then, the main routine for generating the test pattern generation is completed. On the other hand, if the detected fault coverage is equal to or smaller than the predetermined threshold fault coverage Rth (No at step 104), the program flow goes to step 105.

At step 105, a scan flip-flop selection process of a subroutine is executed. Namely, one flip-flop having the maximum controllability is selected from among one or more flip flips having the maximum scan request degree, wherein the scan request degree represents a degree in which a flip-flop is to be converted into a scan flip-flop or to be scanned. Thereafter, the flip-flop selected at step 105 is converted into a scan flip-flop at step 106, and then, an undetected fault list is made including flip-flops whose faults have not been detected at step 107. Thereafter, the program flow goes back to step 103, and then, a test pattern is generated for the flip-flops whose faults have not been detected at step 107.

FIGS. 2a and 2b are flowcharts of the test pattern generation process of the subroutine step 103 shown in FIG. 1. In FIGS. 2a and 2b, A denotes a first state, B denotes a second state into which the first state A is transferred, SI denotes an initial state, SO denotes a final state, SI' denotes a state different from the initial state SI by one bit, and C denotes a state completely different from the initial state SI, the final state SO and the state SI'.

Referring to FIG. 2a, first of all, a determination is made at step 202 as to whether or not there is any undetected fault. If there is no undetected fault (NO at step 202), the program flow returns to the main routine. On the other hand, if there are one or more undetected faults (YES at step 202), one undetected fault is selected at step 203, and then, a fault propagation process is executed at step 204 so that effects of the selected fault can be propagated to external output terminals.

Thereafter, a determination is made at step 204A as to whether or not the fault propagation process is completed or the effects of the selected fault have been propagated to the external output terminals. If the fault propagation process is not completed (NO at step 20A), the program flow goes back to step 202. On the other hand, if the fault propagation process is completed (YES at step 204A), the program flow goes to step 205. At step 205, the final state SO is set to the first state A, and the initial state SI is set to the second state B.

Thereafter, referring to FIG. 2b, the program flow goes to step 206, and then, the first state A is justified using the second state B (=the initial state SI), namely, a combination of external input values or an external test pattern is generated so that a transition process is executed from the second state B (=the initial state SI) to the first state A. Further, a determination is made at step 206A as to whether or not the transition process of step 206 is completed. If the transition process of step 206 is completed (YES at step 206A), the program flow goes back to step 202. On the other hand if the transition process of step 206 is not completed (NO at step 206A), the program flow goes to step 207.

At step 207, the first state A is justified using the second state B (=the state SI'). Namely, the state SI', which is different from the initial state SI by one bit, is generated; the state SI' is set to the second state B, and then, a combination of external input values or an external test pattern is generated so that a transition process is executed from the second state B (=the state SI') to the first state A. Then, a determination is made at step 207A as to whether or not the process of step 207 is completed. If the process of step 207 is not completed (NO at step 207A), the program flow goes to step 210. On the other hand, if the process of step 207 is completed (YES at step 207A), the program flow goes to step 208, and then, a process is executed for recording in the storage unit 5 name data of flip-flops corresponding to bits of different states between the state SI' and the initial state SI. After completion of the process of step 208, the state SI',which is different from the initial state SI by one bit, is set to the first state A at step 209, and then, the program flow goes back to step 206.

At step 210, the third state C, which is completely different from the initial state SI, the final state SO and the state SI' is generated, and then, a combination of external input values or an external test pattern is generated so that a transition process is executed from the state C to the first state A. Namely, a process is executed for justifying the first state A using the state C. Thereafter, a determination is made at step 210A as to whether or not the process of step 210 is completed. If the process of step 210 is completed (YES at step 210A), the state C is set to the first state A at step 211, and then, the program flow goes back to step 206. On the other hand, if the process of step 210 is not completed (NO at step 210A), the program flow goes to step 212.

As described above, the process of steps 204 to 211 is performed for one fault selected at step 203. In the process of step 204, there is a test pattern required for transferring the effects of the fault to the external output terminals. Further, in the process of steps 206 and 210, another test pattern required for transition from a state is generated to another state, and then, if the process of step 206 is completed (YES at step 206A), the test pattern for the one fault at selected at step 203 is generated, and then, the process of step 202 is performed. Then, the test pattern obtained by connecting the test patterns generated at steps 204, 206 and 210 becomes a test pattern for the one fault selected at step 203.

It is to be noted that, when the processing time of the subroutine shown in FIGS. 2a and 2b is larger than a predetermined limit time, an interruption process (not shown) is executed, and then, the program flow goes to step 212. At step 212, one is added to the scan request degree of the flip-flop which has been finally recorded at step 208, and then, the program flow goes back to step 202 of FIG. 2a.

FIGS. 4a to 4g are state transition diagrams showing internal storage states in the conventional IC. In FIGS. 4a to 4g, numerals within ellipses 401 to 409 represent logical states or logical output values of the flip-flops 303 to 308, for example, the initial state SI of 101101 represents that the states of the flip-flops 303 to 308 are 1, 0, 1, 1, 0 and 1, respectively.

In FIGS. 4a to 4g, 401 denotes the initial state SI prior to inputting of signals of a test pattern, 409 denotes an internal state of the flip-flops 303 to 308 after transition by applying signals of the test pattern to the external input terminals, and 408 denotes the final state SO when the fault propagation of step 204 has been completed.

Figure 3:
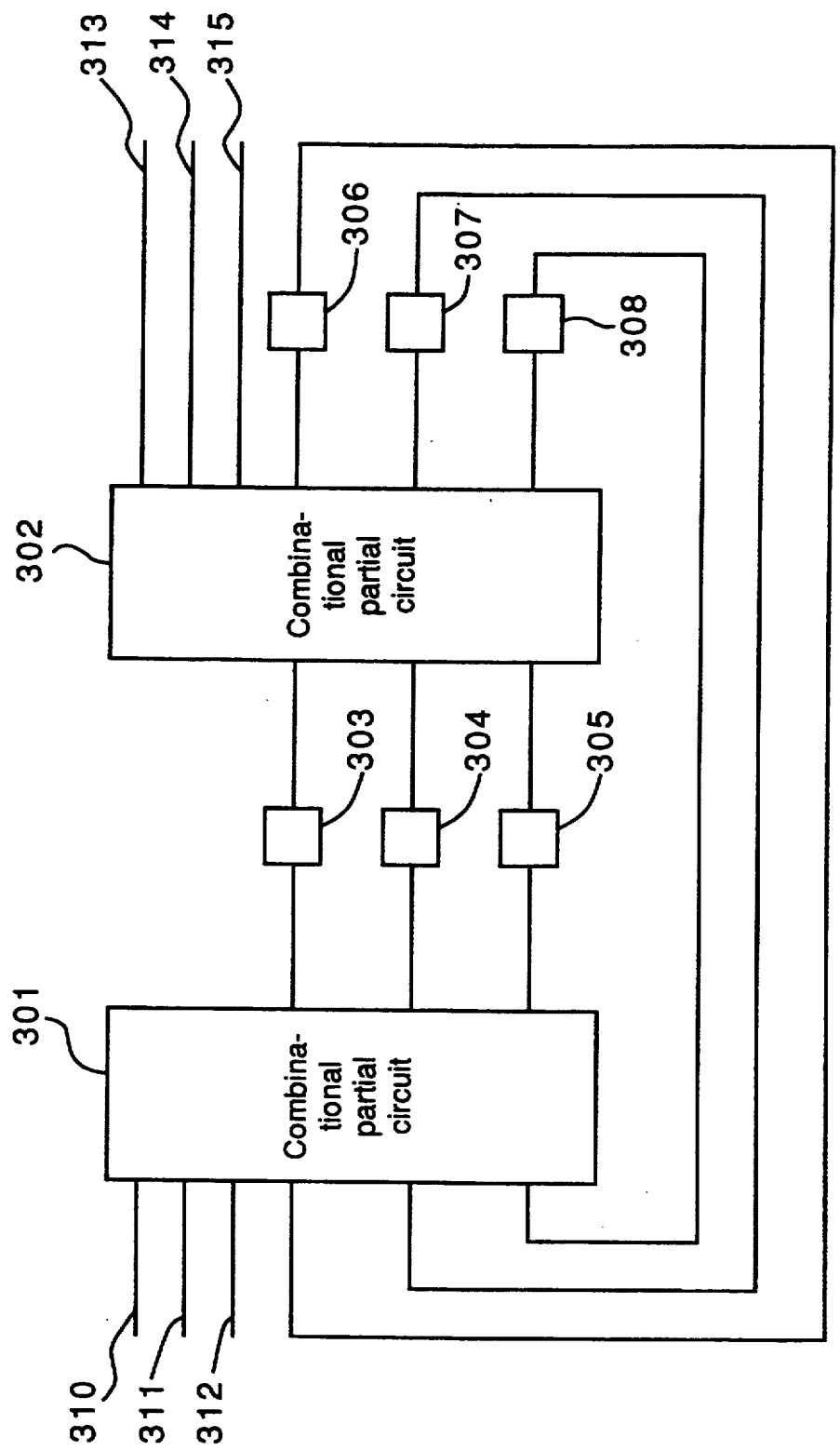
FIG. 3 is a block diagram of a partial sequential logic circuit of a first example of a conventional IC.

FIG. 5 shows the partial sequential logic circuit of the first example of the IC shown in FIG. 3 when the flip-flop 306 is converted into a scan flip-flop 501.

Figure 6:
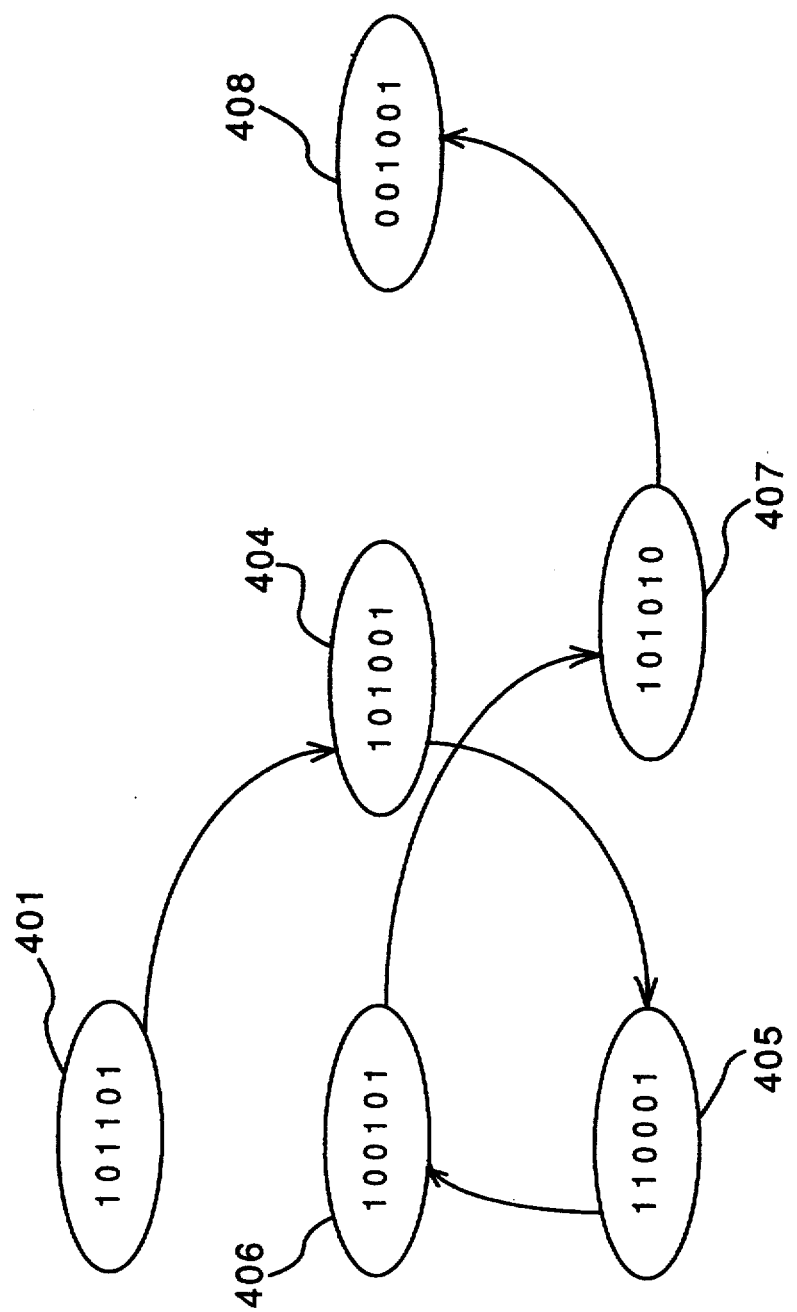
FIG. 6 is a state transition diagram showing internal states of the IC in FIG. 5.

FIG. 6 is a state transition diagram showing internal states of the IC shown in FIG. 5. In FIG. 6, numerals within ellipses of 401 to 408 represent states of the flip-flops 303, 304, 305, 501, 307 and 308. Further, 401 denotes the initial state SI prior to inputting of the signals of the test pattern, 402 to 407 denote internal states of the flip-flops 303, 304, 305, 501, 307 and 308 after transition by applying signals of the test pattern to the external input terminals, and 408 denotes the final state SO when the fault propagation of step 204 has been completed.

An example of an action of the test pattern generation apparatus shown in FIG. 1 will be described below with reference to FIGS. 1 to 6 and 17.

Referring to FIG. 1, first of all, at step 102 a fault list is made including all the flip-flops in fault states within the sequential logic circuit of the IC to be tested, and then, at step 103 the test pattern generation process of the subroutine at step 103 shown in FIGS. 2a and 2b is executed.

Referring to FIG. 2a, first of the subroutine, a determination is made at step 202 as to whether or not there is any undetected fault. If there is no undetected fault (NO at step 202), the test pattern generation process is finished, and then, the program flow returns to the main routine. On the other hand, if there are one or more undetected faults (YES at step 202), one undetected fault is selected at step 203, and then, a fault propagation process is executed at step 204 so that effects of the selected fault can be propagated to external output terminals.

Thereafter, a determination is made at step 204A as to whether or not the fault propagation process is completed or the effects of the selected fault have been propagated to the external output terminals. If the fault propagation process is not completed (NO at step 204A), the program flow goes back to step 202. On the other hand, if the fault propagation process is completed (YES at step 204A), the program flow goes to step 205. At step 205, the final state SO is set to the first state A, and the initial state SI is set to the second state B.

Thereafter, steps 206 to 211 shown in FIG. 2b include a process for generating a test pattern for transition from the initial state 401 prior to inputting of the signals of the test pattern to the final state 408 which is obtained at step 204.

Figure 4A:
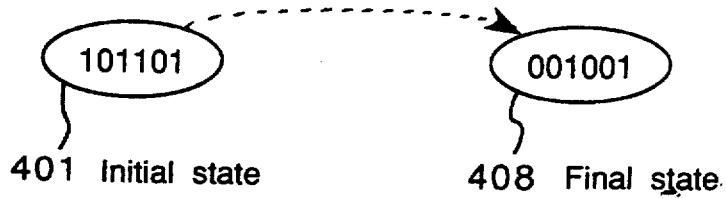
FIGS. 4a to 4g state transition diagrams showing internal states in the conventional IC.

Referring to FIG. 2b, at step 206, a combination of external input values or an external test pattern is generated so that a transition process is executed from the initial state 401 to the final state 408 as shown in FIG. 4a. Further, a determination is made at step 206A as to whether or not the transition process of step 206 is completed. If the transition process of step 206 is completed (YES at step 206A), the program flow goes back to step 202. On the other hand, if the transition process of step 206 is not completed (NO at step 206A), the program flow goes to step 207.

Figure 4B:
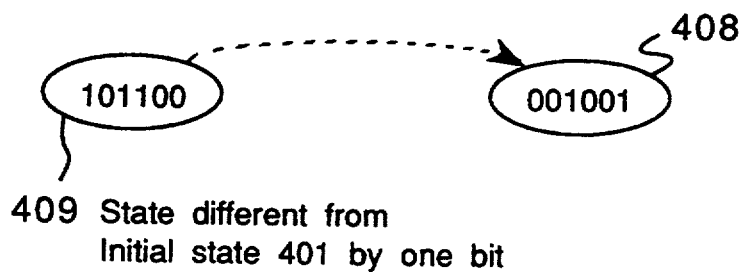

Now, in the case of assuming that the transition process of step 206 shown in FIG. 4a is not completed (NO at step 206A), the program flow goes to step 207, and then, a combination of external input values or an external test pattern is generated so that a transition process is executed from the state 409 which is different from the initial state 401 by one bit, to the final state 408, as shown in FIG. 4b. At step 207, the process thereof is repeatedly performed with all the states different from the initial state 401 by one bit until the process of step 207 is completed. If the process of step 207 is not completed (NO at step 207A), the program flow goes to step 210.

Figure 4C:
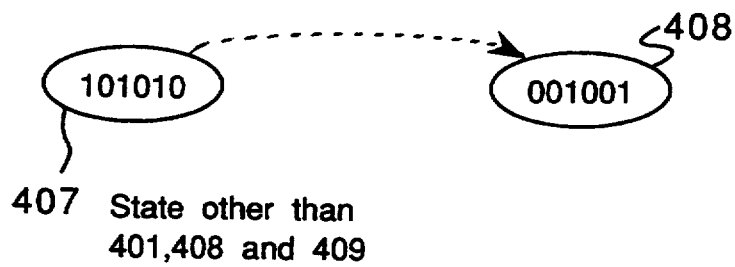

At step 210, as shown in FIG. 4c, a state C, 407, which is completely different from the initial state 401, the final state 408 and the state SI', which is different from the initial state 401 by one bit, is set to the second state B, and then, a combination of external input values or an external test pattern is generated so that a transition process is executed from the state C, 407 to the final state 408. The process of step 210 is repeatedly performed with respect to all the states 407 which can be selected as the second state B until the process thereof is completed. If the process of step 210 is completed (YES at step 210A), the program flow goes to step 206.

Figure 4D:
Figure 4E:
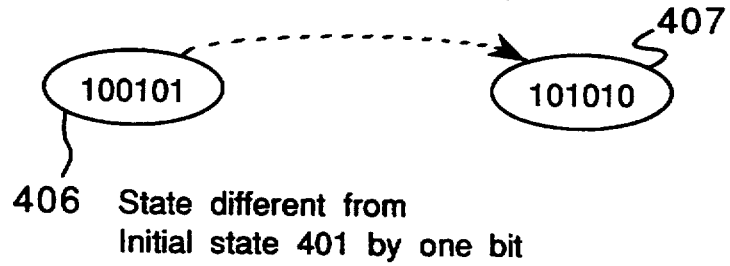
Figure 4F:
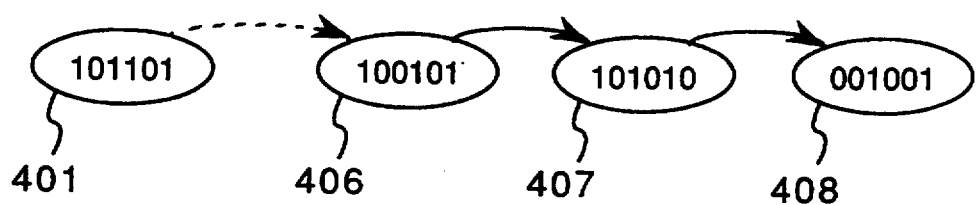
Figure 4G:
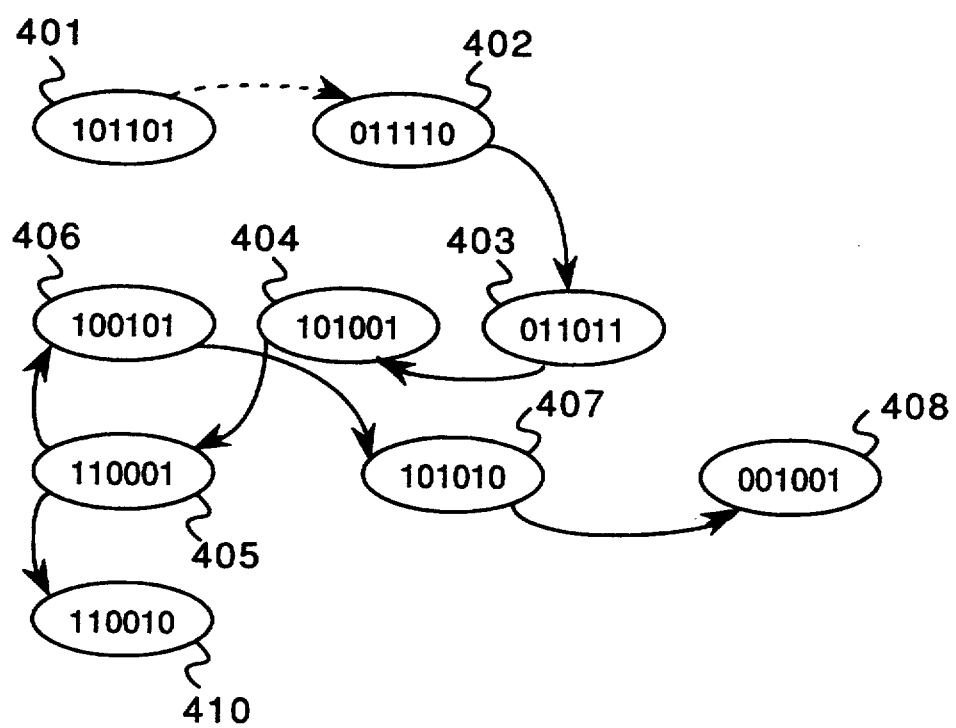

At step 206, as shown in FIG. 4d, a combination of external input values are generated so that a transition process is performed from the initial state 401 to the first state 407. If the process of step 206 is not completed (NO at step 206A), the program flow goes to step 207, and then, external input values are generated so that a transition process is performed from the state 406, which is different from the initial state 401 by one bit, to the final state 407. On the other hand, if the process of step 206 is completed (YES at step 206A), the program flow goes to step 208, and then, name data of the flip-flop 305 corresponding to a bit of a different state between the initial state 401 and the state 406 is recorded.

Further, after the processes of steps 206 to 211 is repeatedly performed, a combination of external input values are obtained for a transition from the state 403 to the state 404 and also another transition from the state 402 to the state 403. Thereafter, when the state 402 is set to the current state and all the processes of steps 206, 207 and 210 are not completed, resulting in stopping of the generating of the test pattern, the program flow goes to step 212, and then, one is added to the scan request degree of the flip-flop 306 finally recorded at the process of step 208. The reason why the scan request degree of the flip-flop 306 finally recorded at the process of step 208 is increased is as follows.

If the process of step 210 is not completed resulting in the stopping of the generating of the test pattern, where there are two flip-flops 305 and 306 as flip-lops recorded at the process of step 208. If the flip-flop 305 is converted into a scan flip-flop, a state transition can be performed in an order from the initial state 401 through the states 406 and 407 to the state final state 408, and then, a test pattern can be generated. On the other hand, if the flip-flop 306 is converted into a scan flip-flop, a state transition can be easily performed in an order from the initial state 401 through the states 404,405, 406 and 407 to the final state 408, and then, a test pattern can be generated. Therefore, in order to detect a fault due to which the process of step 210 is not completed, it is necessary to convert either one of the flip-flops 305 and into a scan flip-flop. However, as is clear from FIG. 4g, in the case that there is another fault detected at the state 410 and a transition can be easily performed from the state 405 to the state 410, if the flip-flop 306 is converted into a scan flip-flop, a state transition can be performed in an order from the state 401 through the states 404 and 405 to the state 410. However, it is difficult to perform a state transition directly from the state 401 to the state 410 even though the flip-flop 305 is converted into a scan flip-flop, and the difficulty of the test can not be further lowered. Accordingly, in the case that the process of step 210 is not completed resulting in the stopping of the generating of the test pattern, there is advantageously used a method of increasing the scan request degree of the flip-flop finally recorded at step 208 other than a method of increasing the scan request degree of any flip-flop recorded at step 208.

Referring back to FIG. 2a, when it is determined that there is no undetected fault (NO at step 202), the process for generating the test pattern is completed, and then, the program flow goes back to step 104 of the main routine shown in FIG. 1. Then, a determination is made at step 104 as to whether or not the detected fault coverage is larger than the predetermined threshold fault coverage Rth. In the present preferred embodiment, the fault coverage is preferably set to a value large than the fault coverage of the conventional apparatus.

If the detected fault coverage is equal to or smaller than the predetermined threshold fault coverage Rth (No at step 104), the program flow goes to step 105, and then, the scan flip-flop selection process of the subroutine is executed. Namely, one flip-flop having the maximum controllability is selected from among one or more flip flips having the maximum scan request degree. The reason why one flip-flop having the maximum controllability is selected from among one or more flip flips having the maximum scan request degree is as follows. Since it is more difficult to set the flip-flop to a desired value generally as the controllability becomes larger, the controllability of the sequential logic circuit of the IC can be remarkably improved or lowered by converting the flip-flop having a relatively large controllability into a scan flip-flop.

Now, in this case, when the scan request degrees of the flip-flops 303 to 308 are 0, 1, 4, 9, 0 and 9 respectively and the controllability of the flip-flops 303 to 308 stored in the storage unit 5 after calculating them by means 3 shown in FIG. 17 are 112, 423, 3982, 1306, 45 and 1196 respectively, the flip-flop 306 is selected at step 105.

Thereafter, the one flip-flop selected at step 105 is converted into a scan flip-flop at step 106. FIG. 5 shows the partial circuit of the sequential logic circuit of the IC when the flip-flop 306 has been converted into the scan flip-flop 501. Thereafter, an undetected fault list is made including flip-flops, faults of which have not been detected at step 107, and then, at step 103 a test pattern is generated for the sequential logic circuit shown in FIG. 5 wherein the flip-flop 306 is converted into the scan flip-flop 501 based on the undetected fault list. Thereafter, the program flow goes to step 104 of the main routine shown in FIG. 1. If the detected fault coverage is larger than he predetermined threshold fault coverage Rth (YES at step 104), the test pattern which has been finally generated a step 103 is set as the test pattern to be used for the sequential logic circuit, and then, the main routine for generating the test pattern generation is completed.

Furthermore, the signal generator 6 generates and outputs to the sequential logic circuit of the IC to be tested, signals of the test pattern generated by the above-mentioned process in a form suitable for the sequential logic circuit to be applied. It is to be noted that FIG. 6 shows a transition of the internal state of the sequential logic circuit shown in FIG. 5 when a fault shown in FIG. 4 is caused.

Table 1 shows a result of a simulation of the conventional test pattern generation apparatus, and Table 2 a result of a simulation of the test pattern generation apparatus of the first preferred embodiment, which were performed by the present inventors. Circuits s400, s713 and s5378 used in the simulations are benchmark circuits described in a second reference of F. Brglez et al., "Combinational Profiles of Sequential Benchmark Circuit", Proceeding International Symposium Circuit and Systems, pp. 1929 to 1934, May 1989.

As is clear from comparison between Tables 1 and 2, in the test pattern generation apparatus, the fault coverages larger than those of the conventional apparatus can be obtained with number of scan flip-flops being smaller than those of the conventional apparatus.

In the first preferred embodiment, an example in the case of converting one flip-flop into a scan flip-flop is described above. However, the present invention is not limited to this, and two or more flip-flops may be selected and then converted into scan flip-flops.

Further, in the first preferred embodiment, at step 207, a state which is different from the initial state by one bit is justified. However, the present invention is not limited to this. A state which is different from the initial state by two or more bits may be justified.

Figure 7A:
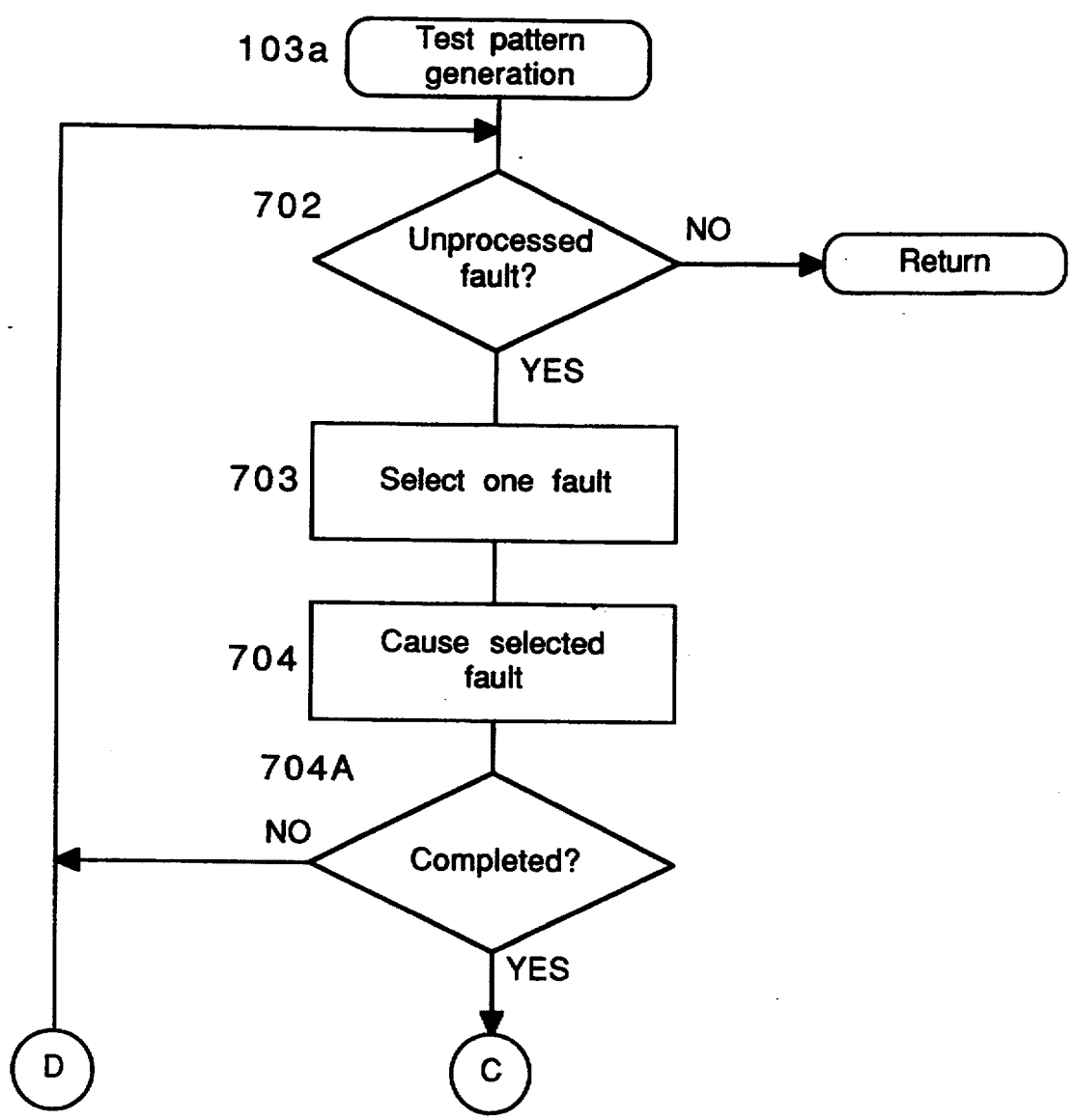
FIG. 7a and 7b are flowcharts of a test pattern generation process of a modified preferred embodiment of the subroutine step 103 shown in FIG. 1.
Figure 7B:
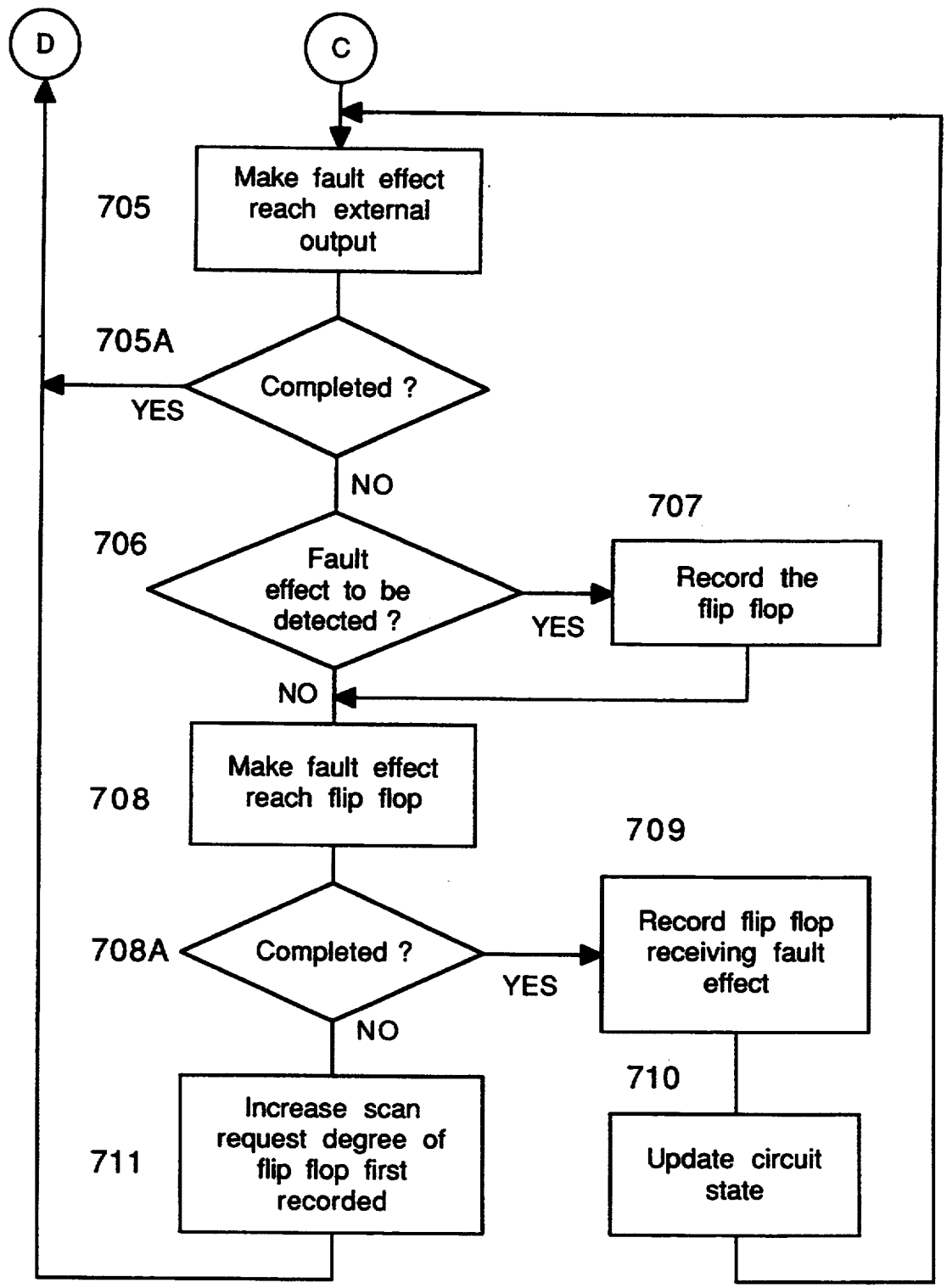

FIG. 7a and 7b are flowcharts of a test pattern generation process of a subroutine step 103a of a modified first preferred embodiment of the subroutine step 103 shown in FIG. 1.

Referring to FIG. 7a, first of all, a determination is made at step 702 as to whether or not there is any undetected fault. If there is no undetected fault (NO at step 702), the program flow returns to the main routine. On the other hand, if there are one or more undetected faults (YES at step 702), one undetected fault is selected at step 703, and then, effects of the selected undetected fault are caused at step 704. Then, a determination is made at step 704A as to whether or not the process of step 704 is completed. If the process of step 704 is not complete (NO at step 704A), the program flow goes back to step 702. On the other hand, if the process of step 704 is completed (YES at step 704A), the program flow goes to step 705 of FIG. 7b.

Referring to FIG. 7b, at step 705 a combination of external input values or an external test pattern are generated so that effects of the selected fault are made to reach the external output terminals in the current circuit state. Then, a determination is made at step 705A as to whether or not the process of step 705 is completed. If the process of step 705 is completed (YES at step 705A), the program flow goes back to step 702. On the other hand, if the process of step 705 is not completed (NO at step 705A), the program flow goes to step 706.

At step 706, a determination is made as to whether or not effects of the fault can be detected when one flip-flop is converted into a scan flip-flop in the current circuit state. If the effects of the fault can be detected (YES at step 707), the flip-flop obtained by the process of step 707 is recorded in the storage unit 5, and then, the program flow goes to step 708. On the other hand, if the effects of the fault can not be detected (NO at step 707), at step 708 external input values or an external test pattern are generated so that the effects of the fault reach at least one flip-flop in the current circuit state.

Thereafter, if the process of step 708 is completed (YES at step 708A), the flip-flop which the effects of the fault has reached at step 708 is recorded in the storage unit 5 at step 709, the current circuit state is updated into a new circuit state based on the result obtained by the process of step 708, and then, the program flow goes back to step 705. On the other hand, if the process of step 708A is not completed (NO at step 708A), one is added to the scan request degree of the flip-flop first recorded at steps 707 and 709, and then, the program flow goes back to step 702.

Figure 8:
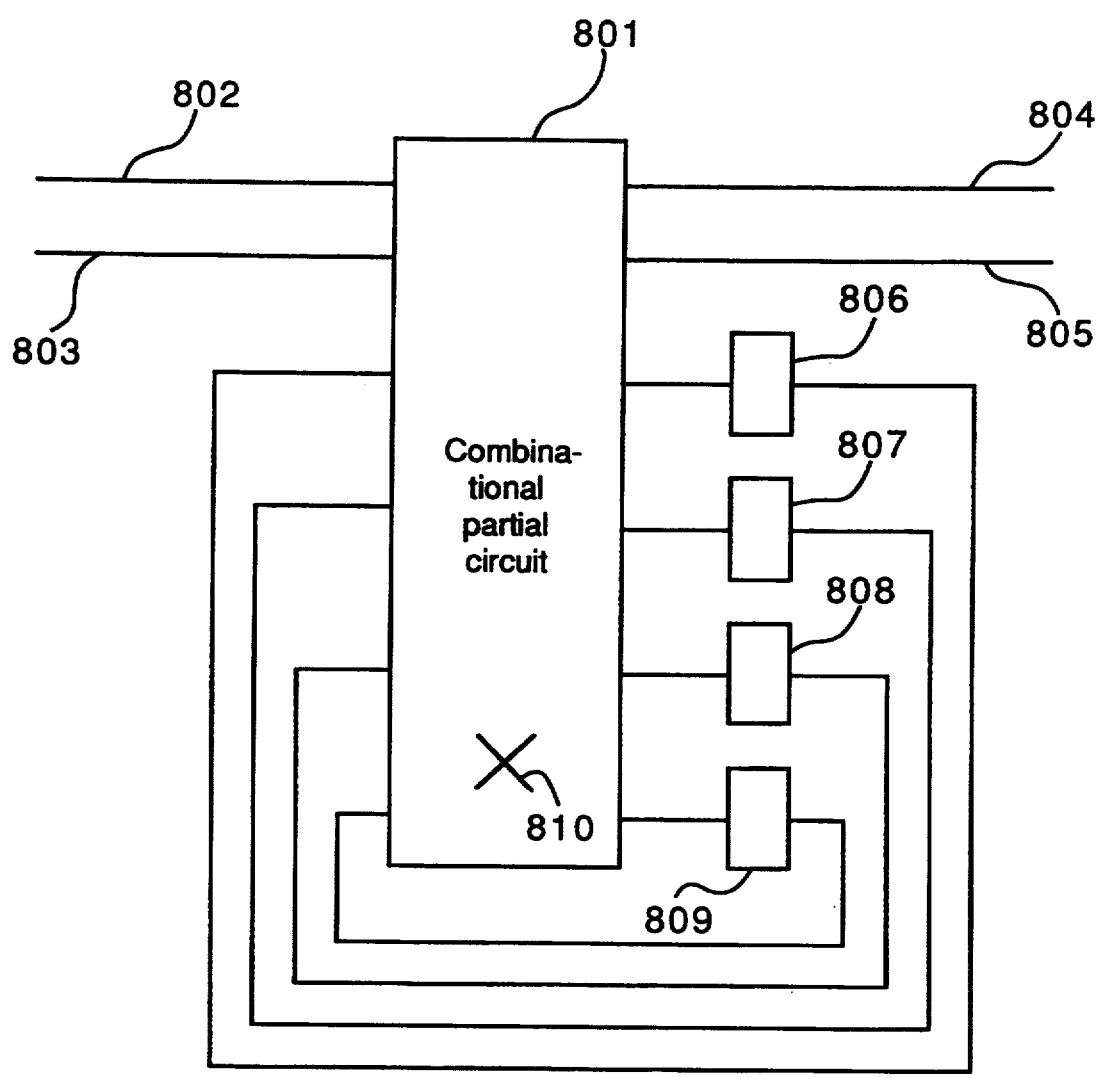
FIG. 8 is a block diagram of a partial sequential logic circuit of a second example of an IC.

FIG. 8 shows a partial sequential logic circuit of a second example of an IC.

Referring to FIG. 8, the partial sequential logic circuit comprises a combinational partial circuit 801 and four flip-flops 806 to 809 respectively connected between output terminals and input terminals of the combinational partial circuit 801. In FIG. 8, 810 denotes a fault caused in the combinational partial circuit 801.

Figure 9A:
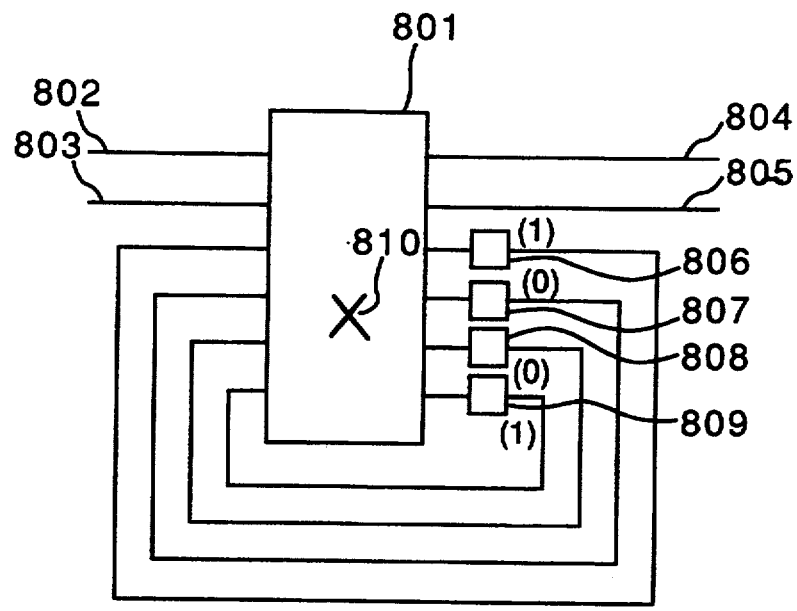
FIGS. 9a to 9e are block diagrams of the second example of the IC showing changes in the states of circuit shown in FIG. 8.
Figure 9B:
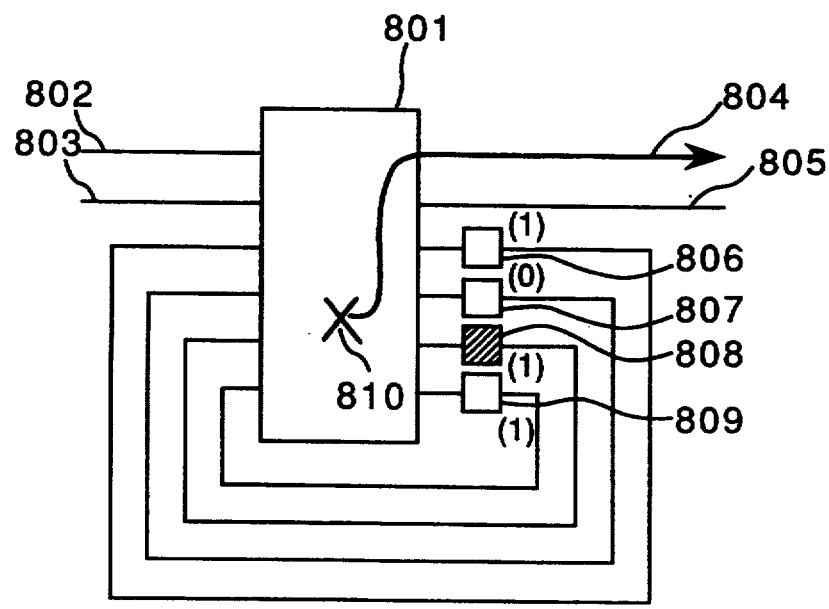
Figure 9C:
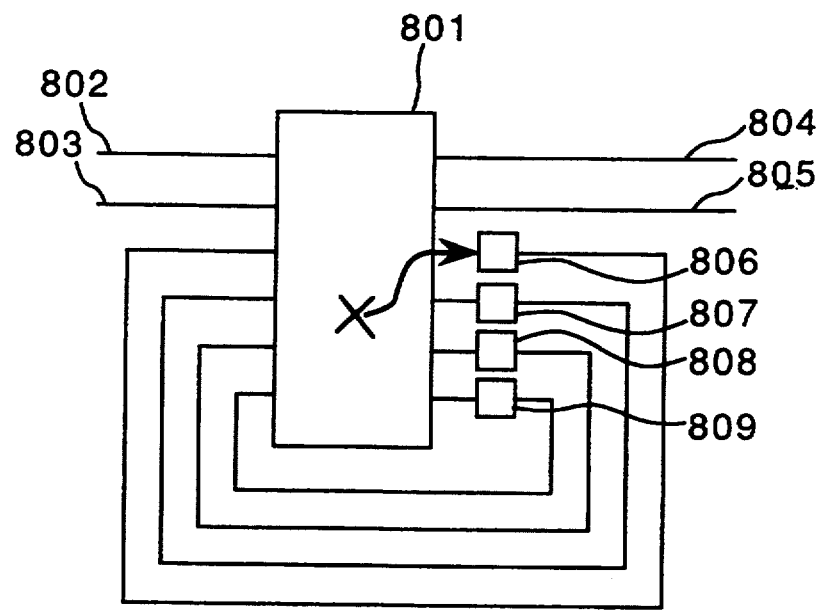
Figure 9D:
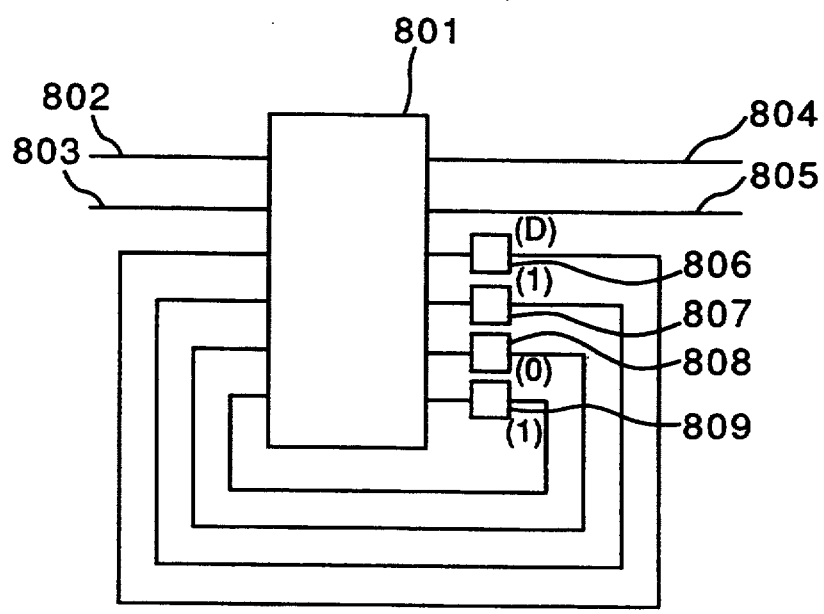
Figure 9E:
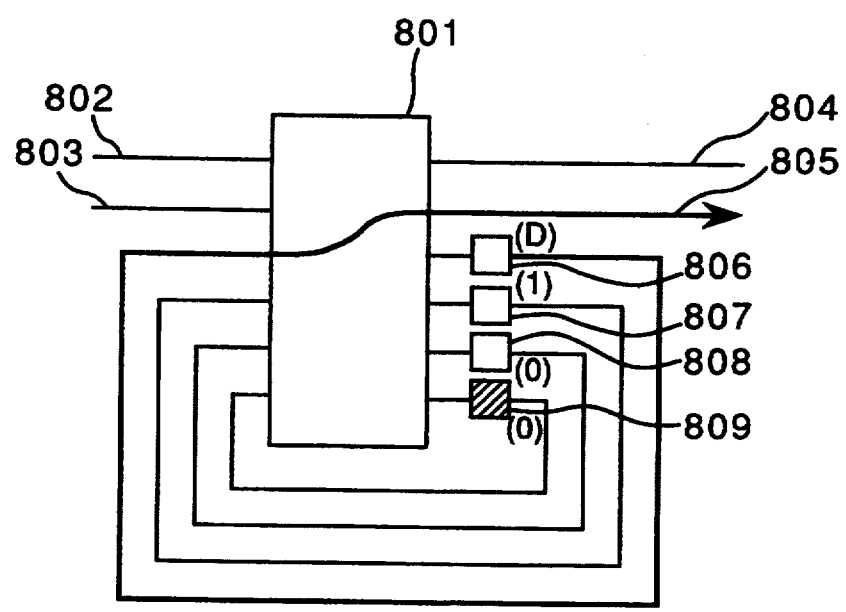

FIGS. 9a to 9e are block diagrams of the second example of the IC showing changes in the circuit state thereof. In FIGS. 9d and 9e, (D) denotes an effect of a fault.

An example of the test pattern generation process of a modified first preferred embodiment will be described with reference to FIG. 7a, 7b, 8 and 9a to 9e.

Referring to FIG. 7a, at first, of the test pattern generation process of the subroutine step 103a, a determination is made at step 702 as to whether or not there is any unprocessed fault. If there is no unprocessed fault (NO at step 702), the program flow returns to the main routine. On the other hand, if there are one or more unprocessed faults (YES at step 702), one unprocessed fault is selected at step 703, and then, effects of the selected unprocessed fault are caused at step 704. Then, if the process of step 704 is not completed (NO at step 704A), the program flow goes back to step 702. On the other hand, if the process of step 704 is completed (YES at step 704A), the program flow goes to step 705 of FIG. 7b.

Now, in the case that the process of step 704 is completed resulting in a circuit state shown in FIG. 9a, referring to FIG. 7b, at step 705 a combination of external input values or an external test pattern is generated so that effects of the selected fault are made to reach the external output terminals in the current circuit state. If the process of step 705 is completed (YES at step 705A), the program flow goes back to step 702. On the other hand, if the process of step 705 is not completed (NO at step 705A), the program flow goes to step 706.

Now, in the case that there are no external input values on the input signal lines 802 and 803 (No at step 705A) so that the effects of the fault 810 have reached the external output terminals in the circuit state shown in FIG. 9a, a determination is made at step 706 as to whether or not the effect of the fault 810 have reached the external output terminals by changing the state of one flip-flop from among the flip-flops 806 to 809. Now, in this example, if the state of the flip-flop 808 is changed from zero to one as shown in FIG. 9b, a determination is made at step 706 effects (D) of the fault 810 have reached the external output terminal 804 when the external input values of the input signal lines 802 and 803 are one and zero, respectively. Namely, if YES at step 706, the flip-flop 808 is recorded at step 707, and then, at step 708 a combination of external input values or an external test pattern is generated so that the effects (D) of fault 810 can reach at least one flip-flop.

Now, in case of assuming that, as shown in FIG. 9c, the effects (D) of the fault 810 have reached the flip-flop 806 when the external input values on the external signal input lines 802 and 803 are 1 and 1, respectively, the flip-flop 806 is recorded at step 709, and then, the circuit state shown in FIG. 8 is shown in FIG. 9d after the process of step 708, which is referred to as a current state.

Subsequently, when the process of step 705 is not completed (NO at step 705A), the state of the flip-flop 809 is changed from one to zero as shown in FIG. 9e, and then, a determination is made at step 706 as to whether or not the effects (D) of the fault 810 have reached the external output terminal 805 when the external input values on the signal lines 802 and 803 are zero and one, respectively. Thereafter, the flip-flop 809 is recorded at step 707.

Now, in this example, in a case of assuming that the effects (D) of the fault 810 have not reached all the flip-flops at step 708, then the program flow goes to step 711. At step 711, one is added to the scan request degree of the flip-flop 808 first recorded from among the flip-flops 806, 808 and 809 recorded at steps 707 and 709.

If there is no unprocessed fault (NO at step 702), the subroutine step 103a is completed, and then, the program flow goes to step 104 of the main routine shown in FIG. 1.

In the modified first preferred embodiment, the process of steps 704 to 711 is executed for one fault selected at step 703. The process of step 704 is provided for generating the test pattern required for causing the effects of the selected fault, the test pattern required for making the effects of the fault reach at-least one of the external output terminals at step 705, and the test pattern is generated which is required for making the effects of the fault reach at least one flip-flop in the sequential logic circuit. If the process of step 705 is completed (YES at step 705A), the test pattern generation for the one fault selected at step 703 is completed, and then, the program flow goes to step 702. Then, the test pattern obtained by connecting the test patterns generated at steps 704, 705 and 708 becomes a test pattern for the one fault selected at step 703.

Referring back to FIG. 1, a determination is made at step 104 of FIG. 1 as to whether or not the detected fault coverage is larger than the predetermined threshold fault coverage Rth. If the detected fault coverage is equal to or smaller than the predetermined threshold fault coverage Rth (No at step 104), the program flow goes to step 105, and then, the scan flip-flop selection process of the subroutine is executed. Namely, one flip-flop having the maximum controllability is selected from among one or more flip flips having the maximum scan request degree.

Now, in this example, when the scan request degrees of the flip-flops 806 to 809 are 1, 6, 2 and 6 respectively and the controllabilities of the flip-flops 806 to 809 stored in the storage unit 5 are 323, 112, 24 and 811 respectively, the flip-flop 809 is selected at step 105.

In the modified first preferred embodiment, the selected flip-flop is a flip-flop to be certainly scanned in the test pattern generation process, which is different from that in the convention apparatus. When the selected flip-flop is converted into a scan flip-flop and the test pattern is generated, the fault coverage can be certainly improved, resulting in removing any useless scan flip-flop.

Thereafter, the process of steps 106, 107, 103 and 104 is executed in a manner similar to that of the first preferred embodiment.

Second Preferred Embodiment

Figure 10:
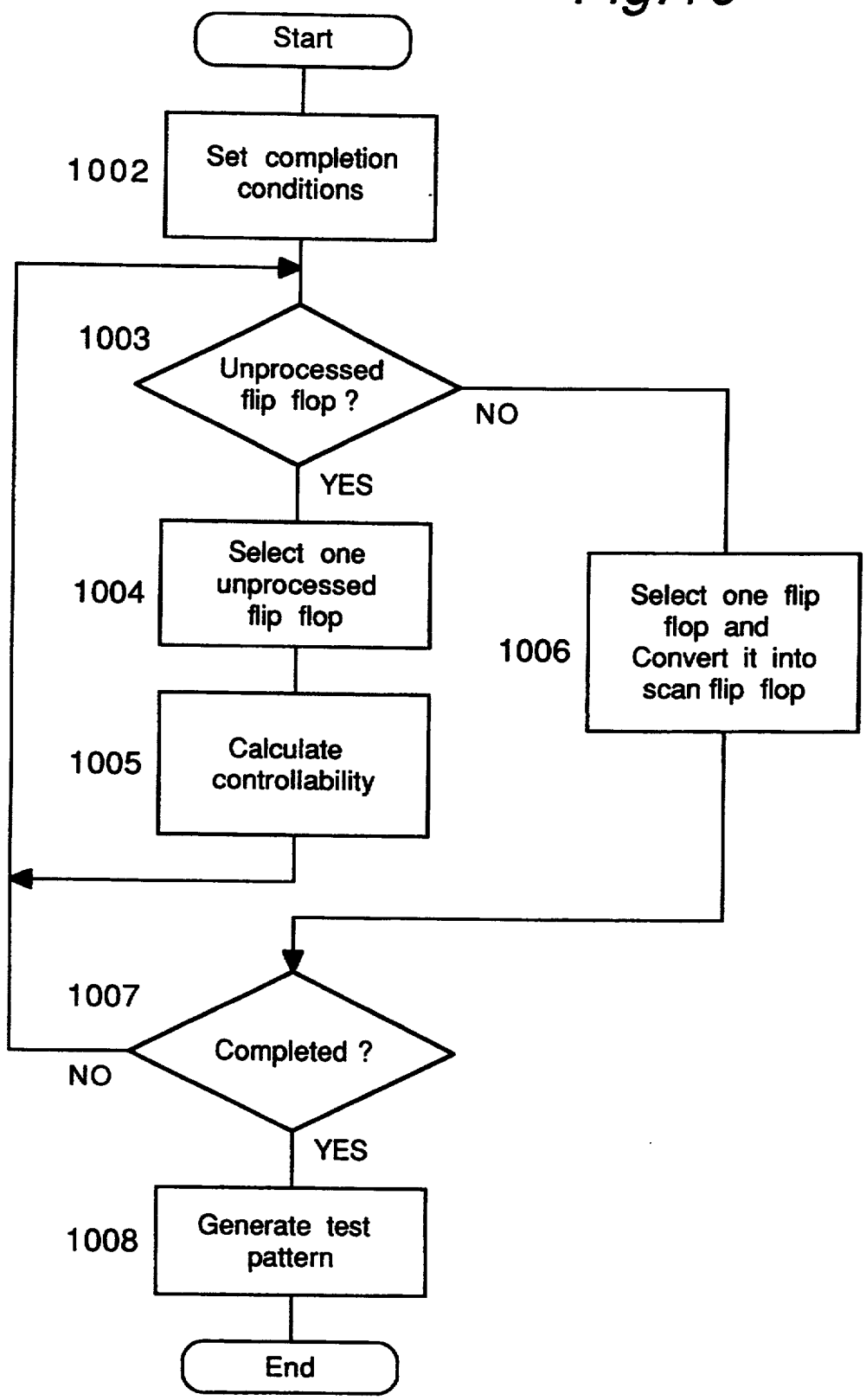
FIG. 10 is a flowchart of a main routine executed by a test pattern generation apparatus of a second preferred embodiment according to the present invention.

FIG. 10 is a flowchart of a main routine executed by a test pattern generation apparatus of a second preferred embodiment according to the present invention.

Referring to FIG. 10, first of all, predetermined completion conditions are set at step 1002, and a determination is made at step 1003 as to whether or not there is an unprocessed flip-flop other than the scan flip-flops. If there are one or more unprocessed flip-flops (YES at step 1003), one unprocessed flip-flop is selected at step 1004, and then, at step 1005 a controllability of all the flip-flops within the sequential logic circuit is calculated on the assumption that the selected flip-flop is converted into a scan flip-flop. Thereafter, the program flow goes to step 1003.

On the other hand, if there is no unprocessed flip-fop (NO at step 1003), at step 1006 one flip-flop is selected and the selected flip-fop is converted into a scan flip-flop. Thereafter, a determination is made at step 1007 as to whether or not the predetermined completion conditions set at step 1002 are satisfied. If the predetermined completion conditions are not satisfied (NO at step 1007), the program flow goes to step 1003. On the other hand, if the predetermined completion conditions are satisfied (YES at step 1007), the program flow goes to step 1008, and then, a test pattern is generated. Then, the test pattern process of the main routine of the second preferred embodiment is completed.

An example of an action of the test pattern generation apparatus of the second preferred embodiment will be described below with reference to FIG. 10.

Referring to FIG. 10, first of all, the predetermined completion conditions set at step 1002. The predetermined completion conditions may include a predetermined upper threshold value of the fault coverage and a predetermined threshold number of an upper limit of scan flip-flops. Namely, one of the predetermined completion conditions may be that the fault coverage is larger than a predetermined value, and another one thereof may be that the number of the scan flip-flops is larger than a predetermined value. In the present preferred embodiment, the threshold number of the upper limit of the scan flip-flops is set to three.

Thereafter, a determination is made at step 1003 as to whether or not there is an unprocessed flip-flop other than the scan flip-flops. Now, in this example, the flip-flops 806 to 809 are in the sequential logic circuit shown in FIG. 8, and they are unprocessed flip-flops. Therefore, the program flow goes to step 1004, one flip-flop is selected from among the processed flip-flops 806 to 809. Now, in this example, in case of assuming that, for example, the flip-flop 806 is selected, at step 1005 a sum of the controllabilities of all of the flip-flops 807 to 809 other than the scan flip-flops within the sequential logic circuit is calculated on the assumption that the selected flip-flop 806 has been converted into a scan flip-flop. In this example, the sum of the controllabilities thereof is 3122.

Thereafter, the program flow goes to step 1003, a determination is made as to whether or not there are one or more unprocessed flip-flops. Now, the flip-flops 807 to 809 have not been processed, and then, for example, the flip-flop 807 is selected at step 1004. Thereafter, at step 1005 a sum of the controllabilities of all of the other flip-flops 806, 808 and 809 other than the unprocessed flip-flop 807 is calculated, and it is assumed that the sum of the controllabilities thereof is 2068, in this example. The process of steps 1003 to 1005 is repeatedly performed for the flip-flops 808 and 809, in a manner similar to that of the above. Now, it is assumed that the sums of the controllabilities calculated at step 1005 are 1063 and 2760, respectively.

Thereafter, since there is no unprocessed flip-flop in the circuit at step 1003 (NO at step 1003), the program flow goes to step 1006. One of the reasons why the test pattern generation for a fault is not completed is that it is difficult to control logical values on the signal lines within the circuit. In order to solve such a problem, it is necessary to find, in particular, the flip-flop which can improve the controllability of the flip-flops, and then, the found flip-flop is converted into a scan flip-flop. In this case, the logical values of the non-scan flip-flops can be easily controlled with a relatively small number of scan flip-flops, resulting in improvement in the fault coverage or lowering the fault coverage.

Therefore, one flip-flop having the minimum controllability is selected from among the flip-flops having the controllability calculated at step 1005. In the case that only one flip-flop is converted into a scan flip-flop from among the flip-flops 806 to 809, the sums of the controllabilities of the other flip-flops are 3022, 2068, 1063 and 2760, respectively. Therefore, in this case, the flip-flop 808 is converted into a scan flip-flop, and then, the program flow goes to step 1007.

A determination is made at step 1007 as to as to whether or not the number of the scan flip-flops is equal to or larger than a predetermined set value. However, now, there is only one scan flip-flop (No at step 1007). Therefore, the program flow goes to step 1003. Since there are unprocessed flip-flops 806, 807 and 809 other than the scan flip-flops, the flip-flop 806 is selected at step 1004. Thereafter, at step 1005, a sum of the controllabilities of all of the flip-flops 807 and 809 other than the scan flip-flop is calculated, and then, it is assumed in this example that the sum thereof is 968.

Thereafter, the process of step 1003 to 1005 is performed for each of the flip-flop 807 and 809 in a manner similar to that of the above, and then, it is assumed in this example that the sums of the controllabilities are 1901 and 1103, respectively, at step 1005. Since the sums of the controllabilities of the other flip-flops when either one of the flip-flops 806, 807 and 809 is converted into a scan flip-flop are 968, 1901 and 1103, respectively, the flip-flop 806 is converted into a scan flip-flop at step 1106.

At step 1007, there two scan flip-flops and the number of the scan flip-flops is not equal to or larger than the predetermined set value of three (NO at step 1007). Therefore, the program flow goes to step 1003, and then, the process of steps 1003 to 1006 is performed in a manner similar to that of above. Then, the flip-flop 809 is selected and is converted into a scan flip-flop at step 1006. Thereafter, there are three flip-flops at step 1007, and the number of the scan flip-flops is equal to or larger than the predetermined set value of three (YES at step 1007). Accordingly, the program flow goes to step 1008, and then, a test pattern is generated. Then, the main routine of the test pattern generation is completed.

Table 3 shows a result of a simulation performed by the present inventor, and the circuits s400 and s713 used in the simulation are the benchmark circuits described in the above-mentioned second reference.

As is clear from comparison between Table 3 of the second preferred embodiment and Table 1 of the conventional apparatus, in the second preferred embodiment, fault coverages can be obtained equal to or larger than those of the conventional apparatus with number of the scan flip-flops being smaller than those of the conventional apparatus.

Third Preferred Embodiment

Figure 11:
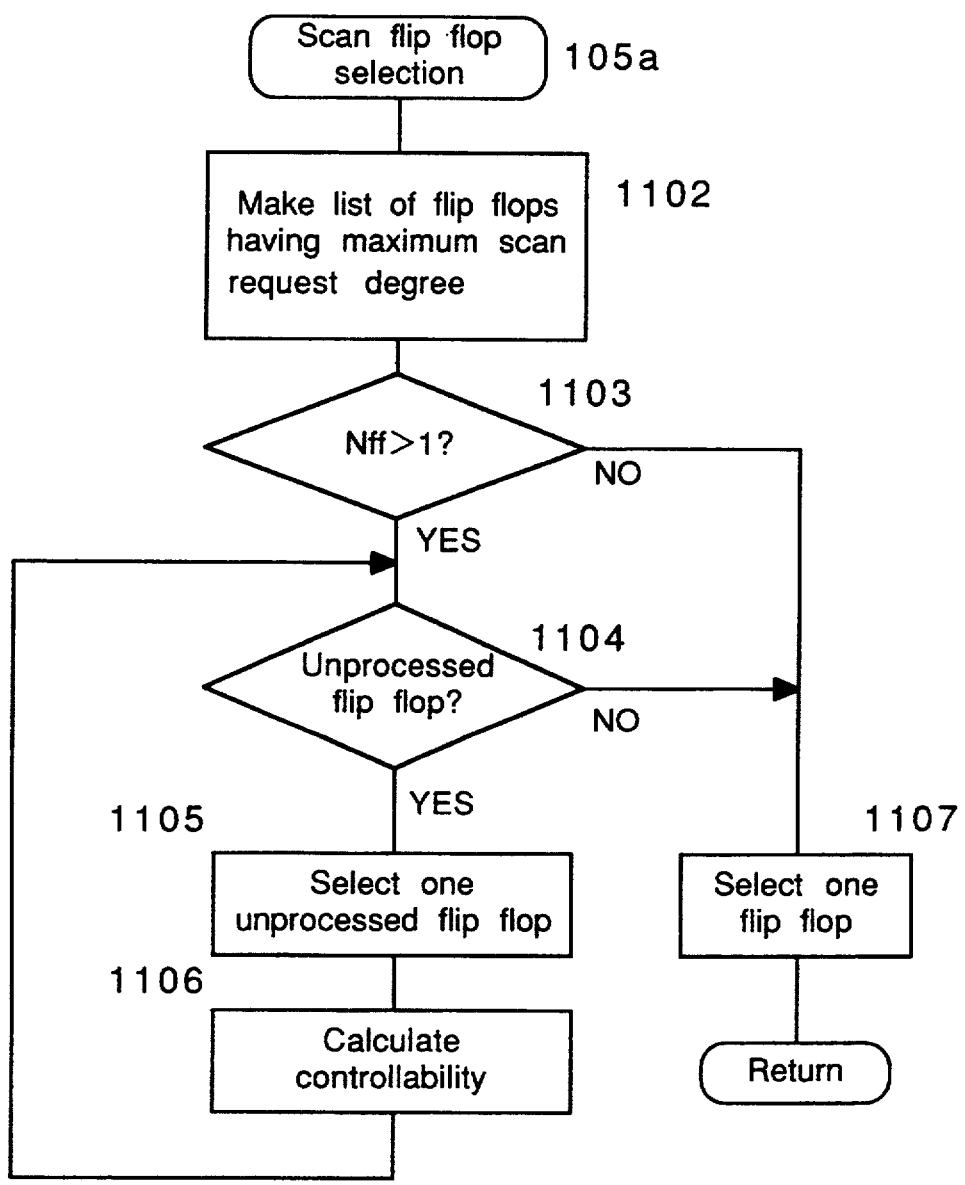
FIG. 11 is a flowchart of a scan flip-flop selection process of a subroutine executed by a test pattern generation apparatus of a third preferred embodiment according to present invention.

FIG. 11 is a flowchart of a flip-flop selection process of a subroutine step 105a executed by a test pattern generation apparatus of a third preferred embodiment according to the present invention. Namely, the flip-flop selection process of step 105 is a modified process of step 105 of the first preferred embodiment shown in FIG. 1. The other processes are the same as those shown in FIG. 1.

Referring to FIG. 11, first of all, a list of flip-flops each having the maximum scan request degree is made at step 1102, and then, a determination is made at step 1103 as to as to whether or not the number Nff of the flip-flops within the list is larger than one. If Nff=1 (NO at step 1103), the program flow goes to step 1107, and then, one flip-flop is selected from among those on the list so that the sum of the controllabilities of the whole circuit is the smallest when the selected one flip-flop is a scan flip-flop. Thereafter, the program flow goes back to the main routine. On the other hand, if Nff>1 (YES at step 1103), a determination is made at step 1104 as to whether or not there are one or more unprocessed flip-flops on the list.

If there is at least one unprocessed flip-flop one the list (YES at step 1104), one unprocessed flip-flop is selected at step 1105, and then, at step 1106 the sum of the controllabilities of the respective flip-flops in the circuit when the selected one flip-flop is calculated is converted into a scan flip-flop. Thereafter, the program flow goes back to step 1104. On the other hand, if there is no unprocessed flip-flop within the list (NO at step 1104), the program flow goes to step 1107.

An example of an action of the third preferred embodiment will be described below with reference to FIG. 11.

Referring to FIG. 11, first of all, a list of flip-flops having the maximum scan request degree based on the information of the scan request degrees of the respective flip-flops which have been obtained by the test pattern generation process of step 103 shown in FIG. 1 is made. Now, in this example, in case of assuming that the scan request degrees of the respective flip-flops 303 to 308 are 0, 1, 4, 9, 0 and 9, respectively, the list made at step 1102 includes the flip-flops 306 and 308 each having the maximum scan request degree of nine. Thereafter, a determination is made at step 1103 as to whether or not the number Nff of the flip-flops on the list is larger than one.

In this example, since Nff>1, the program flow goes to step 1104, and then, a determination is made at step 1104 as to whether or not there are one or more unprocessed flip-flops on the list. In this example, there are two unprocessed flip-flops 306 and 308. Therefore, one flip-flop 306 is selected from among the flip-flops 306 and 308 at step 1105, and then, at step 1106 the sum of the controllabilities of the respective flip-flops in the circuit when the selected flip-flop 306 is converted into a scan flip-flop resulting in the sum thereof of 1812 is calculated.

Thereafter, the program flow goes back to step 1104, and then, a determination is made as to whether or not there is at least one unprocessed flip-flop on the list. In this example, since there is the unprocessed flip-flop 308

(YES at step 1104), the flip-flop 308 is selected at step 1105, and then, at step 1106 the sum of the controllabilities of the respective flip-flops in the circuit when the selected flip-flop 308 is converted into a scan flip-flop resulting in the sum thereof of 3127 is calculated.

Thereafter, the program flow goes back to step 1104, and then, a determination is made as to whether or not there is at least one unprocessed flip-flop within the list. In this example, since there is no unprocessed flip-flop (NO at step 1104), the program flow goes to step 1107. The flip-flop 306 is selected from among the flip-flops 306 and 308 on the list since the sum of the controllabilities of the whole circuit is the smallest when the selected flip-flop 306 is a scan flip-flop. Namely, when the flip-flop 306 is converted into a scan flip-flop, the controllability of the whole circuit can be improved the most or can be lowered the most. Thereafter, the program flow goes back to step 104 of the main routine, and then, the process shown in FIG. 1 is performed in a manner similar to that of the first preferred embodiment.

The features of the third preferred embodiment are to include the process of step 1107. The reason why the process of step 1107 is provided in the scan flip-flop selection process of the subroutine step 105a is as follows.

An object of all of the preferred embodiments according to the present invention which are described in the specification is to decrease or improve the cost of the controllability of the IC. Generally speaking, when a flip-flop having the maximum controllability is converted into a scan flip-flop, the cost of the controllability thereof can not be always improved the most. When a flip-flop is converted into a scan flip-flop even though the cost of the controllability of the flip-flop itself is not so large, there is a possibility of improving or decreasing the cost of the controllability of the whole circuit of the IC. Therefore, when there are a plurality of flip-flops to be scanned, execution of the process of the scan flip-flop selection shown in FIG. 11 can contribute to an improvement or decrease in the cost of the controllability of the IC.

Table 4 shows a result of a simulation performed by the present inventor, and the circuits s400 and s713 used in the simulation are the benchmark circuits described in the above-mentioned second reference.

As is clear from comparison between Table 4 of the third preferred embodiment and Table 1 of the conventional apparatus, in the second preferred embodiment fault coverages can be obtained equal to or larger than those of the conventional apparatus with number of scan flip-flops being smaller than those of the conventional apparatus.

Further, as is clear from comparison between Table 4 of the third preferred embodiment and Table 2 of the first preferred embodiment, in the third preferred embodiment fault coverages can be obtained at least equal to or larger than those of the first preferred embodiment.

Furthermore, as is clear from comparison between Table 4 of the third preferred embodiment and Table 3 of the second preferred embodiment, in the third preferred embodiment the same fault coverages can be obtained as those of the second preferred embodiment with number of scan flip-flops being smaller than those of the second preferred embodiment.

Therefore, the present preferred embodiment can obtained the most improved performance among the first to third preferred embodiment and the prior art.

It is to be noted that the subroutine step 105a of the third preferred embodiment may be applied to the first preferred embodiment.

Fourth Preferred Embodiment

Figure 12:
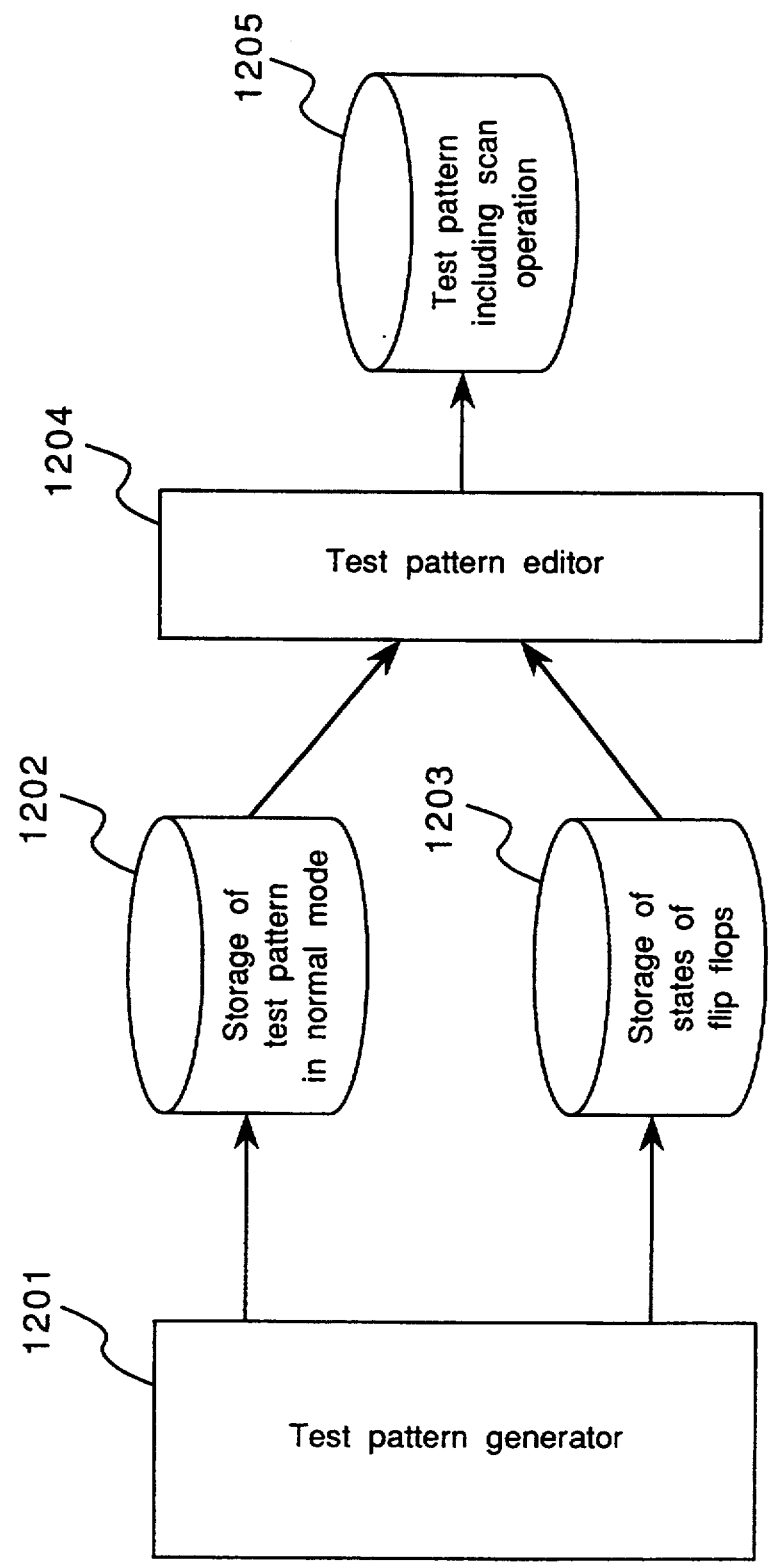
FIG. 12 is a block diagram of a test pattern generation apparatus of a fourth preferred embodiment according to the present invention.

FIG. 12 is a block diagram of a test pattern generation apparatus of a fourth preferred embodiment according to the present invention, and FIG. 12 corresponds to a means 4 for generating the test pattern of the first preferred embodiment shown in FIG. 17.

Referring to FIG. 12, the test pattern generation apparatus comprises a test pattern generator 1201, a storage unit 1202 for storing data of the test pattern generated by the test pattern generator 1201 in a normal mode, a storage unit 1203 for storing data of status of the respective flip-flops while the test pattern is generated by the test pattern generator 1201, a test pattern editor 1204 for editing and generating a test pattern including a test pattern in a scan mode based on the test pattern in the normal mode stored in the storage unit 1202 and the status of the respective flip-flops stored in the storage unit 1203, and a storage unit 1205 for storing data of the test pattern in the scan mode generated by the test pattern editor 1204.

Figure 13:
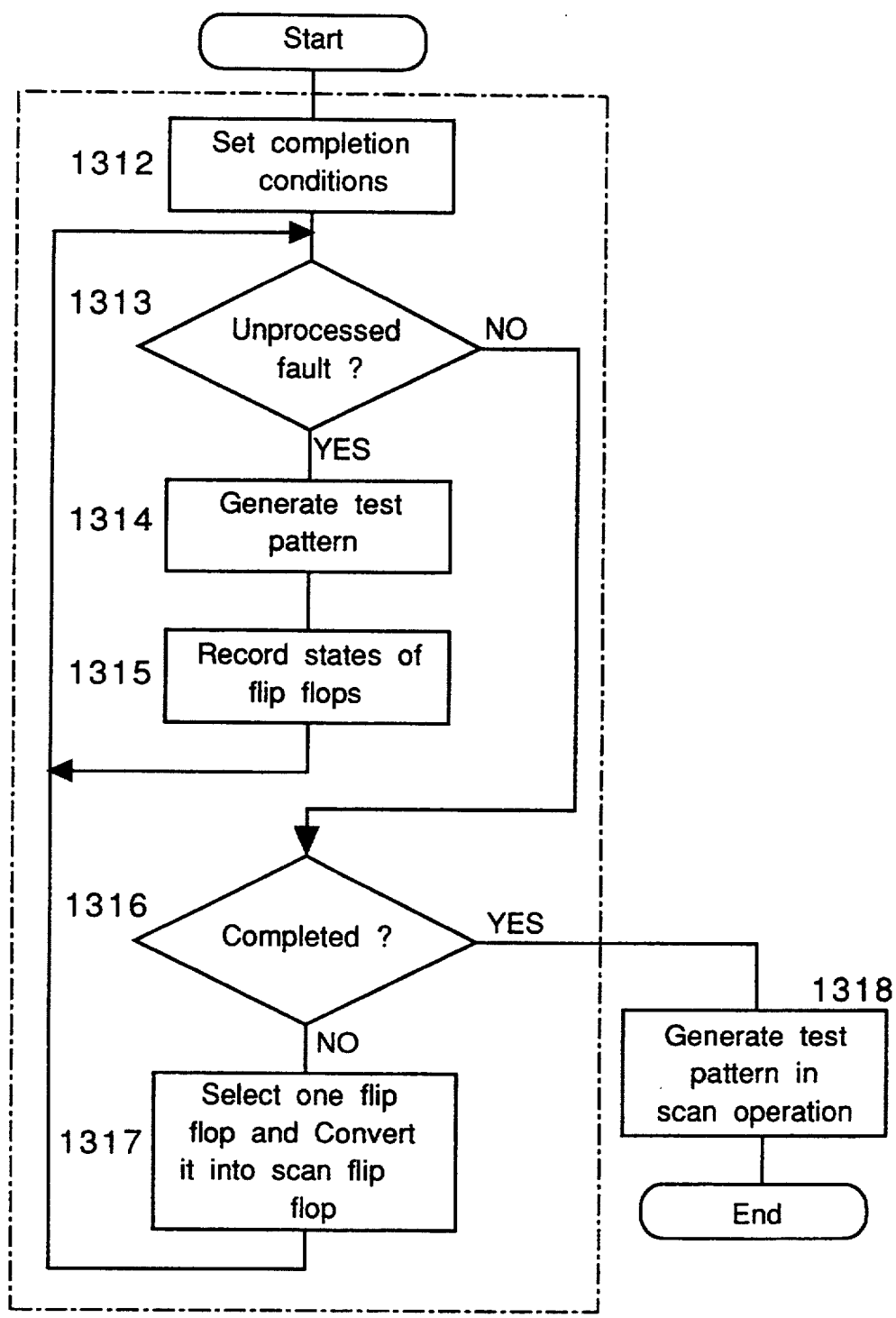
FIG. 13 is a flowchart of a main routine executed by the test pattern generation apparatus of the fourth preferred embodiment.

FIG. 13 is a flowchart of a main routine executed by the test pattern generation apparatus of the fourth preferred embodiment.

Referring to FIG. 13, first of all, predetermined completion conditions are set at step 1312. In the present preferred embodiment, the completion conditions may include a condition of an upper limit of flip-flops to be scanned. The predetermined completion conditions include a predetermined upper threshold of the fault coverage and a predetermined threshold number of an upper limit of scan flip-flops. Namely, one of the predetermined completion conditions may be that the fault coverage is larger than a predetermined value, and another one of the predetermined completion conditions may be that the number of the scan flip-flops is larger than a predetermined value.

Thereafter, a determination is made at step 1313 as to whether or there is any unprocessed fault within the circuit. If there is at least one unprocessed fault (YES at step 1313), the program flow goes to step 1314, and then, one unprocessed fault is selected and a test pattern is generated with respect to the selected unprocessed fault. Thereafter, at step 1315 the status or both the stored logical values of the flip-flops to be scanned within the circuit when the flip-flops are scanned-in and scanned-out are rendered; namely, the flip-flops are set in the above-mentioned scan mode and in the above-mentioned normal mode. Then, the program flow goes back to step 1313.

On the other hand, if there is no unprocessed fault (NO at step 1313), a determination is made at step 1316 as to whether or not the predetermined completion conditions set at step 1323 are satisfied. If NO at step 1316, one flip-flop is selected and the selected flip-flop is converted into a scan flip-flop at step 1317, and then, the program flow goes back to step 1313. On the other hand, if YES at step 1316, a test pattern is generated at step 1318 based on the status of the flip-flops in the normal mode and in the scan mode stored in the storage units 1202 and 1203, and then, the test pattern generation process of the fourth preferred embodiment is completed.

Figure 14A:
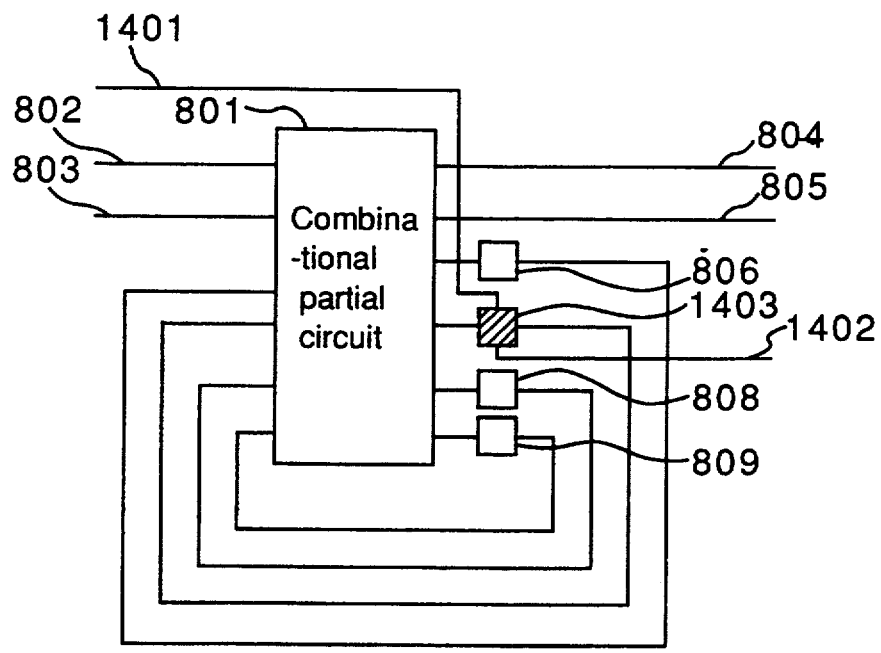
Figure 14B:
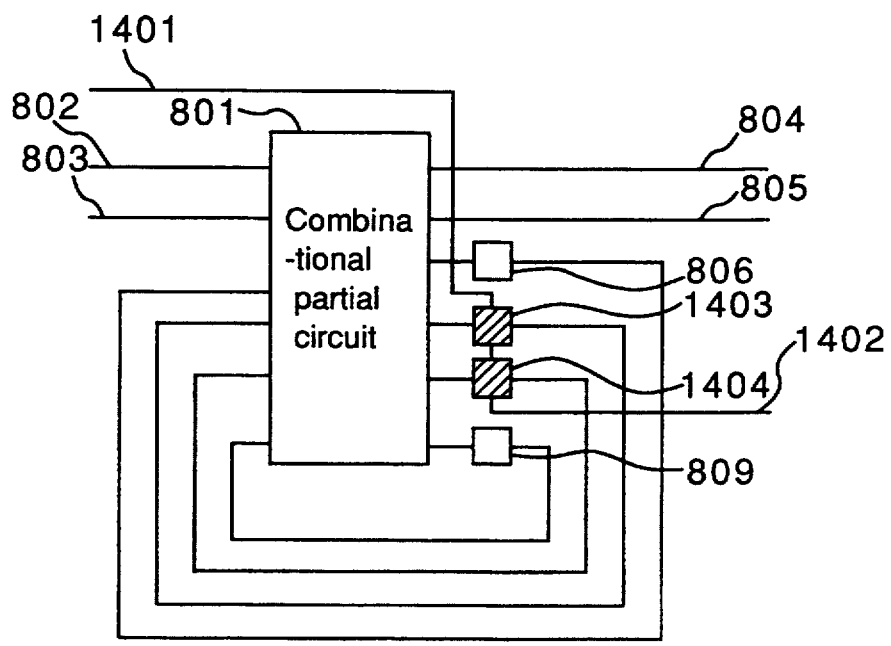
Figure 14C:
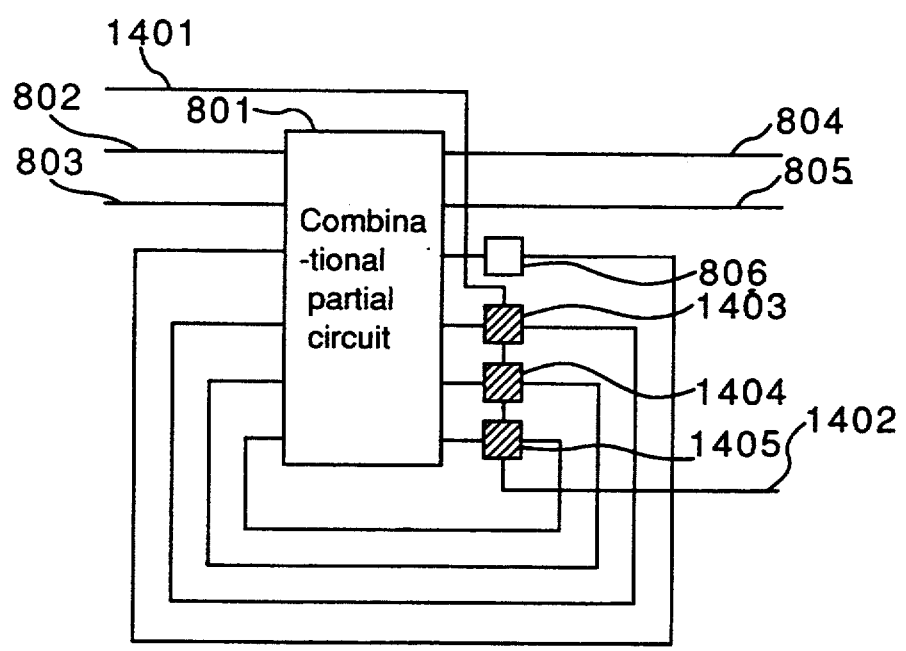
Figure 15:
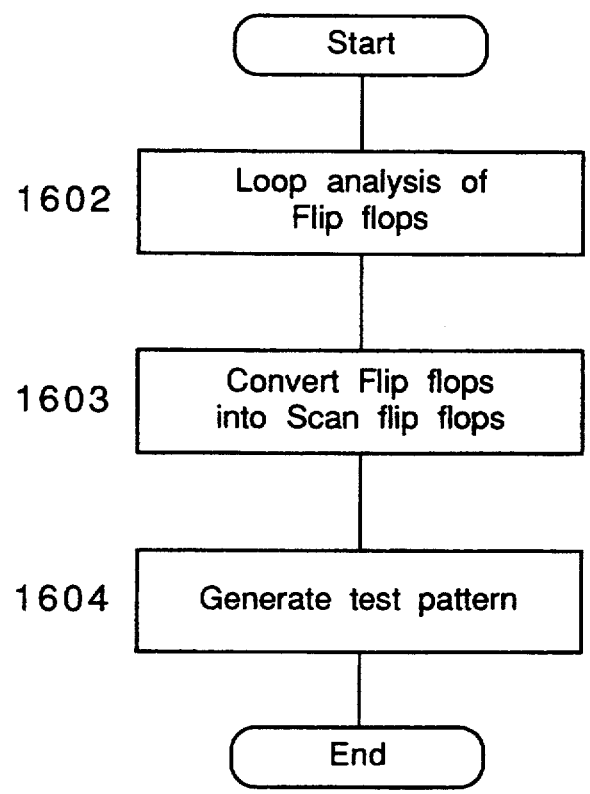
FIG. 15 is a flowchart of a main routine executed by a conventional test pattern generation apparatus.
Figure 16:
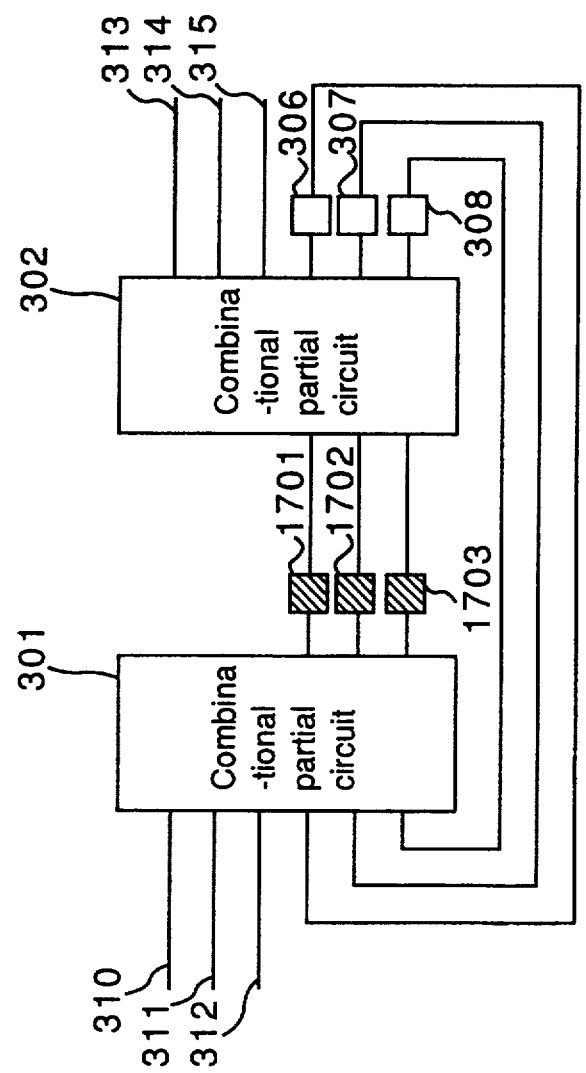
FIG. 16 is a block diagram of a partial sequential logic circuit of an IC showing a test generating process executed by the conventional test pattern generation apparatus.

FIGS. 14a to 14c are block diagrams of partial sequential logic circuits showing the test pattern generation process executed by the test pattern generation apparatus of the fourth preferred embodiment. FIG. 14a shows a state of the sequential logic circuit when the flip-flop 807 is converted into a scan flip-flop 1403 while the test patter generation process is being executed for the sequential logic circuit shown in FIG. 8, FIG. 14b shows a state of the sequential logic circuit at the next stage, and FIG. 14c shows a state of the sequential logic circuit when the flip-flop 808 is further converted into a scan flip-flop 1404 after conversion into the scan flip-flop 1403.

Table 5 shows states of the respective flip-flops at a timing prior to the scan operation and at another timing after the scan operation, and Table 6 shows external test input values or an external test pattern generated at step 1317. In Table 6, MS denotes a signal value on a mode selection signal line. In FIGS. 14a to 14c and Table 6, 1401 denotes a scan-in signal line, 1402 denotes a scan-out signal line, 802 and 803 denote external input signal lines, and 804 and 805 denote external output signal lines.

An example of an action of the test pattern process executed for the sequential logic circuit shown in FIG. 8 by the apparatus of the fourth preferred embodiment will be described below with reference to FIGS. 13 and 14a to 14c.

Referring to FIG. 13, first of all, the predetermined completion conditions are set at step 1312. In the present preferred embodiment, the completion conditions include a condition of an upper limit of the flip-flops to be scanned.

The process of steps 1313 to 1315 is provided for generating a test pattern. Firs of all, a determination is made at step 1313 as to whether or not there is any unprocessed fault within the circuit shown in FIG. 8. If there is at least one unprocessed fault (YES at step 1313), the program flow goes to step 1314, and then, one unprocessed fault is selected and a test pattern is generated with respect: to the selected unprocessed fault. Thereafter, the program flow goes to step 1315, and then, when the scan-in and the scan-out are requested for the scan flip-flop, both the states of all the flip-flops including the scan flip-flops at a timing prior to the scan operation or the operation in the scan mode and at another timing after the scan operation are recorded in the storage unit 1203. Since the states of non-scan flip-flops do not change, the same logical values are recorded as both the states of the non-scan flip-flops at a timing prior to the scan operation and at another timing after the scan operation. In this example, since there is no scan flip-flop in the circuit shown in FIG. 8, the program flow goes to step 1313.

The process of steps 1313 to 1315 is performed again, and if there is no unprocessed fault (NO at step 1313), the program flow goes to step 1316, and then, a determination is made as to whether or not the predetermined completion conditions are satisfied. In this case, since there is no scan flip-flop (NO at step 1316), the program flow goes to step 1317. At step 1317, one flip-flop is selected and the selected flip-flop is converted into a scan flip-flop. In this example, the flip-flop 807 is selected and is converted into the scan flip-flop 1403.

Thereafter, the process of steps 1313 to 1315 is performed again by the sequential logic circuit shown in FIG. 14a. At step 1315, both the states of the flip-flop 1403 to be scanned in the normal mode are recorded in the storage unit 1203 and in the scan mode, and further, both the states of the non-scan flip-flops 806, 808 and 809 in the normal mode and in the scan mode are recorded in the storage unit 1203.

In this example, when the scan flip-flop 1403 is scanned-in or is set in the scan mode so that the state thereof changes from zero to one at a timing $t_i$, the states of the other non-scan flip-flops 806, 808 and 809 are 0, 0 and 1, respectively. In this case, when the state of the scan flip-flop 1403 is set to one by the scan operation or setting it to the scan mode, a signal of a state of zero of the scan flip-flop prior to the scan operation is outputted through the scan-out signal line 1402, Then, both the states of the scan flip-flop 1403 including a state of zero at a timing prior to the scan operation and a state of one at another timing after the scan operation are recorded in the storage unit 1203. On the other hand, at a timing prior to the scan operation, the states of the non-scan flip-flops 806, 808 and 809 are 0,0 and 1, respectively, and they do not change between a timing prior to the scan operation and another timing after the scan operation. Similarly, the process of steps 1313 to 1315 is performed again, and when there is no unprocessed fault (No at step 1313), the program flow goes to step 1316. Then, the completion conditions are judged. In this case, since there is one scan flip-flop (NO at step 1316), the program flow goes to step 1317, and then, the flip-flop 808 is converted into the scan flip-flop 1404, as shown in FIG. 14a.

Further, the process of steps 1313 to 1315 is performed again for the sequential logic circuit shown in FIG. 14b. In this case, at step 1314, both of the states of the scan flip-flops 1403 and 1404 are requested from 0 and 0 to 1 and 1, respectively, at a timing $t_j$. Thereafter, at step 1315, states of 0, 0, 0 and 1 at a timing prior to the scan operation and states of 0, 1, 1 and 1 at another timing after the scan operation of-all the flip-flops 806, 1403, 1404 are recorded in the storage unit 1203 and 809 including the scan flip-flops 1403 and 1404. Similarly, the process of steps 1313 to 1315 is performed again, and when there is no unprocessed fault, the program flow goes to step 1316. Then, the completion conditions are judged at step 1312. In this case, since there is two scan flip-flops 1403 and 1404 (NO at step 1316), the program flow goes to step 1317, and then, the flip-flop 809 is converted into the scan flip-flop 1405 as shown in FIG. 14c.

Further, the process of steps 1313 to 1315 is performed again for the sequential logic circuit shown in FIG. 14c. In this case, at step 1314, the states of the scan flip-flops 1403, 1404 and 1405 are requested from 1, 1 and 0 to 0, 0 and 1, respectively. Thereafter, at step 1315, both of states of 1, 1, 1 and 0 at a timing prior to the scan operation and states of 1, 0, 0 and 1 at another timing after the scan operation of all the flip-flops 806, 1403, 1404 and 1405 including the scan flip-flops 1403, 1404 and 1405 are recorded in the storage unit 1203. Similarly, the process of steps 1313 to 1315 is performed again, and when there is no unprocessed fault, the program flow goes to step 1316. Then, the completion conditions are judged at step 1312. In this case, since there are three scan flip-flops, the program flow goes to step 1318 since the predetermined completion conditions have been satisfied (YES at step 1316), and then, the program flow goes to step 1318.

At step 1318, a test pattern in the scan operation is generated based on the states of the respective flip-flops at timings prior to and after the scan operation which have been recorded in the storage unit 1203, which are shown in Table 5. In Table 5, (p, q, r, s) represents (the state of the flip-flop 806, the state of the flip-flop 1403, the state of the flip-flop 808 or 1404, the state of the flip-flop 809 or 1405). In this example, there are three scan flip-flops 1403 to 1405, wherein they are connected in an order of the scan-in signal line 1401→ the scan flip-flop 1403→ the scan flip-flop 1404→ the scan flip-flop 1405→ the scan-out signal line 1402.

At the timing $t_i$, there is only one scan flip-flop 1403, however, the scan flip-flops 1404 and 1405 are connected thereto, finally. Therefore, upon performing the scan operation, it is necessary to not only make the scan flip-flop 1403 operate but also to make the scan flip-flops 1404 and 1405 operate simultaneously. Therefore, the signal of the state at the timing $t_i$ of the scan flip-flop 1403 is inputted in the scan mode or is scanned-in to the scan flip-flop 1403, and also the signals of the states of 0 and 1 at the timing $t_i$ of the flip-flops 808 and 809 are scanned-in to the scan flip-flops 1404 and 1405, respectively. Further, from the scan-out signal line 1402, the signals of both of the states of the flip-flops 809 and 808 at the timing $t_i$ shown in Table 5 and the state of the scan flip-flop 1403 at a timing prior to the scan operation are outputted sequentially in an order of time. The generated test pattern is written in the storage unit 1205, the contents of which include that the signals of the states to be set in the scan flip-flops 1405, 1404 and 1403 are scanned-in sequentially in n order o time from the scan-in signal line 1401, as shown in the timings $t_i$ to $t_{i+4}$ of Table 6. Further, from the scan-out signal line 1402, the signals of the states of the scan flip-flops 1405, 1404 and 1403 prior to the scan operation are outputted sequentially in an order of time.

Similarly, there are the scan flip-flops 1403 and 1404 at the timing $t_j$, however, the scan flip-flop 1405 is connected thereto, finally. Therefore, it is necessary to scan-in the signals of the states after the scan operation at the timing $t_j$ to the scan flip-flops 1403 and 1404, respectively, and also to scan-in the signals of the states of the flip-flop 809 at the timing $t_j$ to the scan flip-flop 1405. As the test pattern, the signals of the states to be set in the scan flip-flops 1405, 1404 and 1403 are scanned-in sequentially in an order of time from the scan-in signal line 1401, as shown in the timings $t_j$ to $t_j+4$ of Table 6. On the other hand, from the scan-out signal line 1402, the signals of the states of the scan flip-flops 1405, 1404 and 1403 prior to the scan operation are outputted sequentially in an order of time.

Since all the scan flip-flops are determined at the timing $t_k$, the signals of the states after the scan operation at the timing $t_k$ are scanned-in to the scan flip-flops 1403, 1404 and 1405, respectively. As the test pattern, the signals of the states to be set in the scan flip-flops 1405, 1404 and 1403 are scanned-in from the scan-in signal line 1401 sequentially in an order of time, as shown in the timings $t_k$ to $t_{k+4}$ of Table 6. On the other hand, the signals of the states of the scan flip-flops 1405, 1404 and 1403 prior to the scan operation are outputted sequentially in an order of time from the scan-out signal line 1402.

-According to the fourth preferred embodiment, when a scan flip-flop is requested to be scanned-in and scanned-out at a timing for a process of the test pattern generation, there are recorded a state of the scan flip-flop requested to be scanned-in and scanned-out, and the states of all the other flip-flops at the same timing, and then, a test pattern in the scan operation is generated based on the states of the respective flip-flops recorded in the storage unit 1203 after the test pattern generation is completed. Therefore, even though a scan flip-flop is added thereto while the process of the test pattern generation is being performed, the test pattern can be generated with respect to the sequential logic circuit including the added scan flip-flop.

Other Preferred Embodiments

In the preferred embodiments, sequential logic circuits of ICs comprise combinational partial circuits and delay type flip-flops. However, the present invention is not limited to this. The sequential logic circuits of the ICs may comprise the other type storage elements such as J-K type flip-flops, T type flip-flops or the like.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

TABLE 1

| Circuit Name | Flip-flops | | Fault coverage [%] | |
| --- | --- | --- | --- | --- |
| | Number of all flip-flops | Number of scan flip-flops | No scan flip-flop | After scan flip-flop inserted |
| s400 | 21 | 9 | 93.40 | 98.11 |
| s713 | 19 | 7 | 80.90 | 90.71 |
| s5378 | 179 | 32 | 75.54 | 93.38 |

TABLE 2

| Circuit Name | Flip-flops | | Fault coverage [%] | |
| --- | --- | --- | --- | --- |
| | Number of all flip-flops | Number of scan flip-flops | No scan flip-flop | After scan flip-flop inserted |
| s400 | 21 | 8 | 91.04 | 98.11 |
| s713 | 19 | 2 | 81.93 | 91.22 |
| s5378 | 179 | 15 | 72.65 | 93.89 |

TABLE 3

| Circuit Name | Flip-flops | | Fault coverage [%] | |
| --- | --- | --- | --- | --- |
| | Number of all flip-flops | Number of scan flip-flops | No scan flip-flop | After scan flip-flop inserted |
| s400 | 21 | 7 | 91.04 | 98.11 |
| s713 | 19 | 3 | 81.93 | 91.22 |

TABLE 4

| Circuit Name | Flip-flops | | Fault coverage [%] | |
| --- | --- | --- | --- | --- |
| | Number of all flip-flops | Number of scan flip-flops | No scan flip-flop | After scan flip-flop inserted |
| s400 | 21 | 6 | 91.04 | 98.11 |
| s713 | 19 | 2 | 81.93 | 91.22 |

TABLE 5

| | Prior to Scan operation | After Scan operation |
| --- | --- | --- |
| Timing $t_i$ | (0, 0, 0, 1) | (0, 1, 0, 1) |
| Timing $t_j$ | (0, 0, 0, 1) | (0, 1, 1, 1) |
| Timing $t_k$ | (1, 1, 1, 0) | (1, 0, 0, 1) |

TABLE 6

| Timing | (MS, 1401, 1402) | (802, 803, 804, 805) |
| --- | --- | --- |
| $t_0$ | (0, —, —) | (0, 0, 1, 0) |
| $t_1$ | (0, —, —) | (1, 1, 0, 0) |
| ... | ... | |
| $t_i$ | (1, —, —) | |
| $t_{i+1}$ | (1, 1, 1) | |
| $t_{i+2}$ | (1, 0, 0) | |
| $t_{i+3}$ | (1, 1, 0) | |
| $t_{i+4}$ | (0, —, —) | |
| ... | ... | |
| $t_j$ | (1, —, —) | |
| $t_{j+1}$ | (1, 1, 1) | |
| $t_{j+2}$ | (1, 1, 0) | |
| $t_{j+3}$ | (1, 1, 0) | |
| $t_{j+4}$ | (0, —, —) | |
| ... | ... | |
| $t_k$ | (1, —, —) | |
| $t_{k+1}$ | (1, 1, 0) | |
| $t_{k+2}$ | (1, 0, 1) | |
| $t_{k+3}$ | (1, 0, 1) | |
| $t_{k+4}$ | (0, —, —) | |
| ... | ... | |

What is claimed is:

1. An apparatus for generating a test pattern for a sequential logic circuit including a plurality of storage elements each storage element storing a logical value of one bit, logical values of bits of said plurality of storage elements being represented by a state, said apparatus comprising:

first input value generating means of generating a combination of first external input values so that a transition process is performed from a second state of said plurality of storage elements to a first state thereof;

first state generating-means for generating a third state different from said second state by a predetermined natural number of bits;

second input value generating means for generating a combination of second external input values so that a transition process is performed from a third state of said plurality of storage elements to said first state thereof;

second state generating means for generating a fourth state other than said first to third states;

third input value generating means for generating a combination of third external input values so that a transition process is performed from a fourth state of said plurality of storage elements to said first state thereof;

first setting means for setting said fourth state as said first state;

storage means for storing name data of storage elements corresponding to bits of different states between said second and third states;

second setting means for setting said third state as said first state;

scan request degree increasing means for increasing a degree of requesting a scan operation for each of said storage elements, name data of which have been stored in said storage means;

scan storage element selecting means for selecting storage elements to be scanned based on said degree of requesting the scan operation;

scan converting means for converting said storage elements selected by said scan storage element selecting means into scan storage elements; and test pattern generating means for generating a test pattern for said sequential logic circuit when said storage elements selected by said scan storage element selecting means are converted into scan storage elements by said scan converting means.

2. The apparatus as claimed in claim 1,
wherein said first input value generating means, said first state generating means, said second input value generating means, said second state generating means, said third input value generating means, said first setting means, said storage means and said second setting meåns are made to operate a plurality of times for a plurality of faults in said sequential logic circuit.

3. The apparatus as claimed in claim 2,
wherein said scan request degree increasing means increases said degree of requesting the scan operation for said storage element, name data of which has been finally stored in said storage means.

4. The apparatus as claimed in claim 2,
wherein said scan storage element selecting means comprises:

calculating means for calculating controllabilities of a plurality of said storage elements each having the maximum degree of requesting the scan operation;

controllability selecting means for selecting the maximum controllability among the controllabilities calculated by said calculating means; and element selecting means for selecting a storage element corresponding to the maximum controllability selected by said controllability selecting means.

5. The apparatus as claimed in claim 2,
wherein scan storage element selecting means comprises:

calculating means for calculating each controllability of said sequential logic circuit when each of a plurality of storage elements each having the maximum degree of requesting the scan operation is converted into a scan storage element;

controllability selecting means for selecting the minimum controllability among the controllabilities calculated by said calculating means; and element selecting means for selecting a storage element corresponding to the minimum controllability selected by said controllability selecting means.

6. An apparatus for generating a test pattern for a sequential logic circuit including a plurality of storage elements each storage element storing a logical value of one bit, logical values of bits of said plurality of storage elements being represented by a state, said apparatus comprising:

input value generating means for generating a combination of external input values so that effects of a fault of said sequential logic circuit reach external output terminals thereof;

storage element selecting means for selecting storage elements, states of which are necessary to be changed in order that the effects of the fault of said sequential logic circuit reach said external output terminals thereof;

storage means for storing said storage elements selected by said storage element selecting means;

scan request degree increasing means for increasing degree of requesting a scan operation for each of said storage elements, name data of which have been stored in said storage means;

scan storage element selecting means for selecting storage elements to be scanned based on said degree requesting the scan operation;

scan converting means for converting said storage elements selected by said scan storage element selecting means into scan storage elements; and test pattern generating means for generating a test pattern for said sequential logic circuit when said storage elements selected by said scan storage element selecting means are converted into scan storage elements by said scan converting means, wherein said input value generating means, said storage element means selecting means and said storage means are made to operate a plurality of times for a plurality of faults in said sequential logic circuit, wherein scan storage element selecting means comprises:

calculating means for calculating each testability cost of said sequential logic circuit required for testing said sequential logic circuit when each of a plurality of storage elements each having the maximum degree of requesting the scan operation is converted into a scan storage element;

testability cost selecting means for selecting the minimum testability cost among the testability costs calculated by said calculating means; and element selecting means for selecting a storage element corresponding to the minimum testability cost selected by said testability cost selecting means.

7. An apparatus for generating a test pattern for a sequential logic circuit including a plurality of storage elements, comprising:

calculating means for calculating each testability cost of said sequential logic circuit required for testing said sequential logic circuit when each of a plurality of storage elements is converted into a scan storage element;

testability cost selecting means for selecting the minimum testability cost among the testability costs calculated by said calculating means;

storage element selecting means for selecting a storage element corresponding to the minimum testability cost selected by said testability cost selecting means;

scan converting means for converting said storage elements selected by said storage element selecting means into scan storage elements; and test pattern generating means for generating a test pattern for said sequential logic circuit when said storage elements selected by said scan storage element selecting means are converted into scan storage element by said scan converting means.

8. The apparatus as claimed in claim 7, wherein said calculating means, said testability cost selecting means and said storage element selecting means are made to operate a plurality of times until a predetermined completion condition is satisfied.

9. The apparatus as claimed in claim 8,
wherein said predetermined completion condition is that a fault coverage of said sequential logic circuit is larger than a predetermined value.

10. The apparatus as claimed in claim 8,
wherein said predetermined completion condition is that the number of said scanned storage elements is larger than a predetermined value.

11. An apparatus for generating a test pattern for a sequential logic circuit including a plurality of storage elements each storage element storing a logical value of one bit, logical values of bits of said plurality of storage elements being represented by a state, said apparatus comprising:

fault selecting means for selecting a fault among a plurality of faults of said sequential logic circuit;

test pattern generating means for generating a test pattern for said fault selected by said fault selecting means;

state storage means for storing both of states of said plurality of storage elements when storage elements to be scanned are scanned-in and states of said plurality of storage elements when said storage elements to be scanned are not scanned-in in the case that said test pattern is generated by said test pattern generating means;

scan storage element selecting means for selecting a storage element to be scanned among said storage elements to be scanned in the case that said test pattern is generated by said test patter generating means;

scan converting means for converting said storage element selected by said storage element selecting means into scan storage elements; and test pattern generating means for generating a test pattern for said sequential logic circuit when said storage elements selected by said scan storage element selecting means are converted into scan storage elements by said scan converting means, based on said states thereof stored in said storage means.

12. The apparatus as claimed in claim 11,
wherein said fault selecting means, said test pattern generating means, said state storage means, said storage element selecting means and said scan converting means are made to operate a plurality of times until a predetermined completion condition is satisfied.

13. The apparatus as claimed in claim 12,
wherein said predetermined completion condition is that a fault coverage of said sequential logic circuit is larger than a predetermined value.

14. The apparatus as claimed in claim 12,
wherein said predetermined completion condition is that the number of said scanned storage elements is larger than a predetermined value.

15. A method of generating a test pattern for a sequential logic circuit including a plurality of storage elements each storage element storing a logical value of one bit, logical values of bits of said plurality of storage elements being represented by a state, said method including steps of:
generating a combination of first external input values so that a transition process is performed from a second state of said plurality of storage elements to a first state thereof;
generating a third state different from said second state by a predetermined natural number of bits;
generating a combination of second external input values so that a transition process is performed from a third state of said plurality of storage elements to said first state thereof;
generating a fourth state other than said first to third states;
generating a combination of third external input values so that a transition process is performed from a fourth state of said plurality of storage elements to said first state thereof;
setting said fourth state as said first state;
storing in storage means name data of storage elements corresponding to bits of different states between said second and third states;
setting said third stage as said first state;
increasing a degree of requesting a scan operation for each of said storage elements, name data of which have been stored in said storage means;
selecting storage elements to be scanned based on said degree of requesting the scan operation;
converting said selected storage elements into scan storage elements; and
generating a test pattern for said sequential logic circuit when said selected storage elements are converted into scan storage elements.

16. The method as claimed in claim 15,
wherein a process of said first external input values generating step to said third state setting step are performed a plurality of times for a plurality of faults in said sequential logic circuit.

17. The method as claimed in claim 16,
wherein said scan request degree increasing step includes a step of increasing said degree of requesting the scan operation for said storage element, name data of which has been finally stored in said storage means.

18. The method as claimed in claim 16,
wherein said scan storage element selecting step includes steps of:
calculating controllabilities of a plurality of said storage elements each having the maximum degree of requesting the scan operation;
selecting the maximum controllability among said calculated controllabilities; and
selecting a storage element corresponding to said selected maximum controllability.

19. The method as claimed in claim 16,
wherein scan storage element selecting step includes steps of;
calculating each controllability of said sequential logic circuit when each of a plurality of storage elements each having the maximum degree of requesting the scan operation is converted into a scan storage element;
selecting the minimum controllability among the calculated controllabilities; and
selecting a storage element corresponding to the selected minimum controllability.

20. A method of generating a test pattern for a sequential logic circuit including a plurality of storage elements each storage element storing a logical value of one bit, logical values of bits of said plurality of storage elements being represented by a state, said method including steps of:
generating a combination of external input values so that effects of a fault of said sequential logic circuit reach external output terminals thereof;
selecting storage elements, states of which are necessary to be changed in order that the effects of the fault of said sequential logic circuit reach said external output terminals thereof;
storing said selected storage elements in storage means;
increasing a degree of requesting a scan operation for each said storage elements, name data of which have been stored in said storage means;
selecting storage elements to be scanned based on said degree of requesting the scan operation;
converting said selected storage elements into scan storage elements; and
generating a test pattern for said sequential logic circuit when said selected storage elements selected are converted into scan storage elements,
wherein said external input values generating step, said storage elements selecting step and said storing step are performed a plurality of times for a plurality of faults in said sequential logic circuit,
wherein scan storage element selecting step includes steps of;
calculating each testability cost of said sequential logic circuit required for testing said sequential logic circuit when each of a plurality of storage elements each having the maximum degree of requesting the scan operation is converted into a scan storage element;
selecting the minimum testability cost among the calculated testability costs; and
selecting a storage element corresponding to the selected minimum testability cost.

21. A method of generating a test pattern for sequential logic circuit including a plurality of storage elements, including steps of:
calculating each testability cost of said sequential logic circuit required for testing said sequential logic circuit when each of a plurality of storage elements is converted into a scan storage element;
selecting the minimum testability cost among the calculated testability costs;
selecting a storage element corresponding to the selected minimum testability cost;
converting said selected storage elements into scan storage elements; and
generating a test pattern for said sequential logic circuit when said selected storage elements are converted into scan storage elements.

22. The method as claimed in claim 21,
wherein said calculating step, said testability cost selecting step and said storage element selecting step are performed a plurality of times until a predetermined completion condition is satisfied.

23. The method as claimed in claim 22,
wherein said predetermined completion condition is that a fault coverage of said sequential logic circuit is larger than a predetermined value.

24. The method as claimed in claim 22,
wherein said predetermined completion condition is that the number of said scanned storage elements is larger than a predetermined value.

25. A method of generating a test pattern for a sequential logic circuit including a plurality of storage elements each storage element storing a logical value of one bit, logical values of bits of said plurality of storage elements being represented by a state, said method including steps of:

selecting a fault among a plurality of faults of said sequential logic circuit;

generating a test pattern for said selected fault;

storing both of states of said plurality of storage elements in storage means when storage elements to be scanned are scanned-in and states of said plurality of storage elements when said storage elements to be scanned are not scanned-in in the case that said test pattern is generated;

selecting a storage element to be scanned among said storage elements to be scanned in the case that said test pattern is generated;

converting said selected storage element into scan storage elements; and generating a test pattern for said sequential logic circuit when said selected storage elements are converted into scan storage elements, based on said states thereof stored in said storage means.

26. The method as claimed in claim 25,
wherein said fault selecting step, said test pattern generating step, said states storing step, said storage element selecting step and said scan converting step are performed a plurality of times until a predetermined completion condition is satisfied.

27. The method as claimed in claim 26,
wherein said predetermined completion condition is that a fault coverage of said sequential logic circuit is larger than a predetermined value.

28. The method as claimed in claim 26,
wherein said predetermined completion condition is that the number of said scanned storage elements is larger than a predetermined value.

* * * * *